(12) United States Patent
Toda

(10) Patent No.: US 9,171,598 B2
(45) Date of Patent: Oct. 27, 2015

(54) MEMORY SYSTEM

(71) Applicant: Kabushiki Kaisha Toshiba, Minato-ku (JP)

(72) Inventor: Haruki Toda, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 64 days.

(21) Appl. No.: 14/079,005

(22) Filed: Nov. 13, 2013

(65) Prior Publication Data

US 2015/0071019 A1  Mar. 12, 2015

Related U.S. Application Data

(60) Provisional application No. 61/874,580, filed on Sep. 6, 2013.

(51) Int. Cl.
*G11C 8/00* (2006.01)
*G11C 8/08* (2006.01)

(52) U.S. Cl.
CPC .................................... *G11C 8/08* (2013.01)

(58) Field of Classification Search
CPC ........ G11C 8/08; G11C 13/0069; G11C 5/14; G11C 11/4067; G11C 11/4085; G11C 11/4094; G11C 2213/72; G11C 2213/79; G11C 7/12
See application file for complete search history.

(56) References Cited

U.S. PATENT DOCUMENTS

| 8,023,313 | B2 | 9/2011 | Toda |
| 2008/0258129 | A1 | 10/2008 | Toda |
| 2010/0054019 | A1 | 3/2010 | Toda |
| 2012/0168705 | A1* | 7/2012 | Liu et al. ............................ 257/4 |
| 2012/0201069 | A1 | 8/2012 | Honda |
| 2012/0236628 | A1 | 9/2012 | Ikeda et al. |
| 2013/0250652 | A1 | 9/2013 | Toda |

FOREIGN PATENT DOCUMENTS

| JP | 2005-522045 | 7/2005 |
| JP | 2010-55719 | 3/2010 |
| JP | 4660095 | 1/2011 |
| JP | 5016151 | 6/2012 |
| JP | 2012-164399 | 8/2012 |
| JP | 2012-203936 | 10/2012 |

(Continued)

OTHER PUBLICATIONS

U.S. Appl. No. 14/078,948, filed Nov. 13, 2013, Toda.

(Continued)

*Primary Examiner* — Thong Q Le
(74) *Attorney, Agent, or Firm* — Oblon, McClelland, Maier & Neustadt, L.L.P.

(57) ABSTRACT

A memory system according to the embodiment comprises a cell array including a unit cell array, the unit cell array containing plural first lines, plural second lines intersecting the plural first lines, and plural memory cells provided at the intersections of the plural first lines and the plural second lines and operative to store data in accordance with different physical states; and an access circuit operative to make access to the memory cell via the first line and the second line, wherein the access circuit, on writing data in the access cell, uses a non-access-side first line driver to electrically connect a non-access first line adjacent to an access first line to a first potential power supply via a diode-connected transistor.

20 Claims, 24 Drawing Sheets

(56) References Cited

FOREIGN PATENT DOCUMENTS

| | | |
|---|---|---|
| JP | 2013-200929 | 10/2013 |
| JP | 2013-200930 A | 10/2013 |

OTHER PUBLICATIONS

U.S. Appl. No. 14/078,677, filed Nov. 13, 2013, Toda.
U.S. Appl. No. 14/480,951, filed Sep. 9, 2014, Toda.

* cited by examiner

FIG. 34
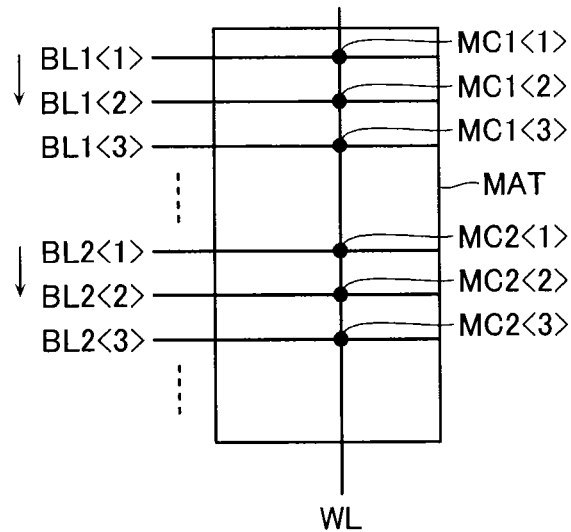
FIG. 35
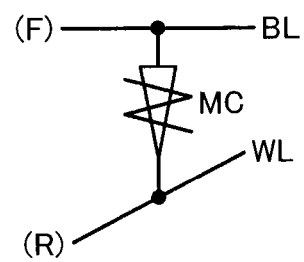
FIG. 36
'0' Write
| R | F |
|---|---|
| Vset/2 | |
| Vss | Vset |
| Vset | Vset/2 |
| Vss | Vset/2 |
| Vset/2 | |

'1' Write

| R | F |
|---|---|
| Vset/2 ||
| Vss | Vset |
| Vset | Vss |
| Vss | Vset/2 |
| Vset/2 ||

Read

| R | F |
|---|---|
| Vset/2 ||
| Vss | Vread |
| Vset/2 ||

'00' Process

| R | F1 | F2 |
|---|----|----|
| Vset/2 |||
| Vss | Vset | Vset |
| Vset | Vset/2 | Vset/2 |
| Vss | Vset/2 | Vset/2 |
| Vset/2 |||

FIG. 41

'10' Process

| R | F1 | F2 |
|---|----|----|
| Vset/2 | | |
| Vss | Vset | Vset |
| Vset | Vss | Vset/2 |
| Vss | Vset/2 | Vset/2 |
| Vset/2 | | |

FIG. 42

'01' Process

| R | F1 | F2 |
|---|----|----|
| Vset/2 | | |
| Vss | Vset | Vset |
| Vset | Vset/2 | Vss |
| Vss | Vset/2 | Vset/2 |
| Vset/2 | | |

FIG. 43

'11' Process

| R | F1 | F2 |
|---|----|----|
| Vset/2 | | |
| Vss | Vset | Vset |
| Vset | Vss | Vss |
| Vss | Vset/2 | Vset/2 |
| Vset/2 | | |

| Value | Write Process |
|---|---|
| 3 (r-r) | '11' Process |
| 2 (s-r) | '01' Process |
| 1 (r-s) | '10' Process |
| 0 (s-s) | '00' Process |

FIG. 48

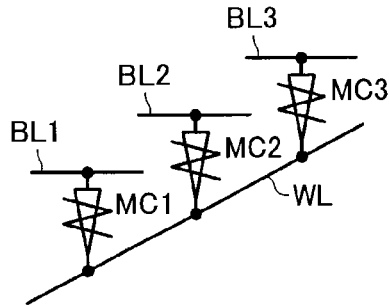

FIG. 49

| Code | | $\varepsilon=2$ Equivalent ECC | | $\varepsilon=1$ Equivalent ECC | | N/A | N/A (4-Terminal Cell) |
|---|---|---|---|---|---|---|---|
| | | LCM | BCH | LCM | Hamming | | |
| p | | p=7 | p=5 | p=2 | p=5 | p=2 | p=2 | p=2 |
| Retention Fault Property | Pf | Good | Good | Good | Good | Good | Good | Good |
| | ~(Pf)² | Good | Good | Good | Good | Good | Good | Good |
| | ~(Pf)³ | Bad | Good | Good | Bad | Good | Bad | Good |
| | ~(Pf)⁴ | Bad | Bad | Good | Bad | Good | Bad | Bad |
| | ~(Pf)⁶ | Bad | Bad | Good | Bad | Bad | Bad | Bad |
| Number of Code Cells | | 24 | 16 | 12 | 16 | 8 | 4 | 9 |
| Number of Information Cells | | 12 | 4 | 4 | 8 | 4 | 4 | 6 |
| Number of Information Bits | | 8.4 | 2.3 | 2 | 4.6 | 2 | 2 | 2 |
| Number of Cells /Number of Bits | | 2.86 | 6.96 | 6 | 3.48 | 4 | 2 | 3 |

MEMORY SYSTEM

CROSS-REFERENCE TO RELATED APPLICATIONS

This application is based upon and claims the benefit of priority from the prior U.S. Provisional Application 61/874,580, filed on Sep. 6, 2013, the entire contents of which are incorporated herein by reference.

BACKGROUND

1. Field

The embodiment of the present invention relates to a memory system.

2. Description of the Related Art

As the technologies for realizing mass-storable memory systems, memory cells of the variable resistance type, such as ReRAMs and ion memories, have received attention. These memory cells can be formed of the cross point type between selection lines and accordingly it is possible to easily construct a cell array having a three-dimensional structure.

These memory cells of the variable resistance type include ones that have asymmetrical characteristics of which voltage-current characteristic greatly changes in accordance with the direction of bias applied to the memory cell. For the cell array having the three-dimensional structure that includes the memory cells having such the asymmetrical voltage-current characteristic, an access operation of the so-called floating access method is effective. The access operation of the floating access method is referred to as an access method of providing an access-targeted selection line with a potential required to make access to a memory cell while bringing non-access selection lines into the floating state.

The cost of a memory system chip is considered here. From the viewpoint of the cost of the chip, the higher the share of the chip area by a cell array, the lower the cost required to realize a mass-storable memory system. Such the three-dimensionally structured memory cell including memory cells of the cross point type, however, generally requires peripheral circuits such as large-sized decoders and drivers. Therefore, an increase in the share of the chip area by the cell array requires the cell array to be made on a larger scale.

If the cell array is made larger, however, occurrences of faults in memory cells increase naturally. Therefore, it is important in such the memory system to handle fault memory cells.

BRIEF DESCRIPTION OF THE DRAWINGS

FIG. 34 is a diagram illustrative of an example of a method of configuring a parallel cell in the memory system according to the embodiment.

FIG. 35 is a diagram illustrative of selection line potential setting at the time of parallel write/read operation to plural memory cells in the memory system according to the embodiment.

FIG. 36 is a diagram illustrative of selection line potential setting at the time of parallel write operation to plural memory cells in the memory system according to the embodiment.

FIG. 41 is a diagram illustrative of selection line potential setting at the time of write operation to a three-terminal cell in the memory system according to the embodiment.

FIG. 42 is a diagram illustrative of selection line potential setting at the time of write operation to a three-terminal cell in the memory system according to the embodiment.

FIG. 43 is a diagram illustrative of selection line potential setting at the time of write operation to a three-terminal cell in the memory system according to the embodiment.

FIG. 48 is a circuit diagram of a four-terminal cell in the memory system according to the embodiment.

FIG. 49 is a diagram showing relations among ECC codes and retention fault rates in the memory system according to the embodiment.

DETAILED DESCRIPTION

A memory system according to the embodiment comprises a cell array including a unit cell array, the unit cell array containing plural first lines, plural second lines intersecting the plural first lines, and plural memory cells provided at the intersections of the plural first lines and the plural second lines and operative to store data in accordance with different physical states; and an access circuit operative to make access to the memory cell via the first line and the second line, wherein an access-targeted memory cell of the plural memory cells is defined as an access cell, a first line connected to the access cell of the plural first lines is defined as an access first line and other first lines as non-access first lines, the access circuit includes two first line drivers each operative to alternately control the first lines on alternate lines, one for controlling the access first line of the two first line drivers is defined as an access-side first line driver and the other as a non-access-side first line driver, and the access circuit, on writing data in the access cell, uses the non-access-side first line driver to electrically connect the non-access first line adjacent to the access first line to a first potential power supply via a diode-connected transistor.

A memory system according to the embodiment is described below with reference to the drawings.

A configuration of the memory system according to the embodiment is described first.

Figure 1:
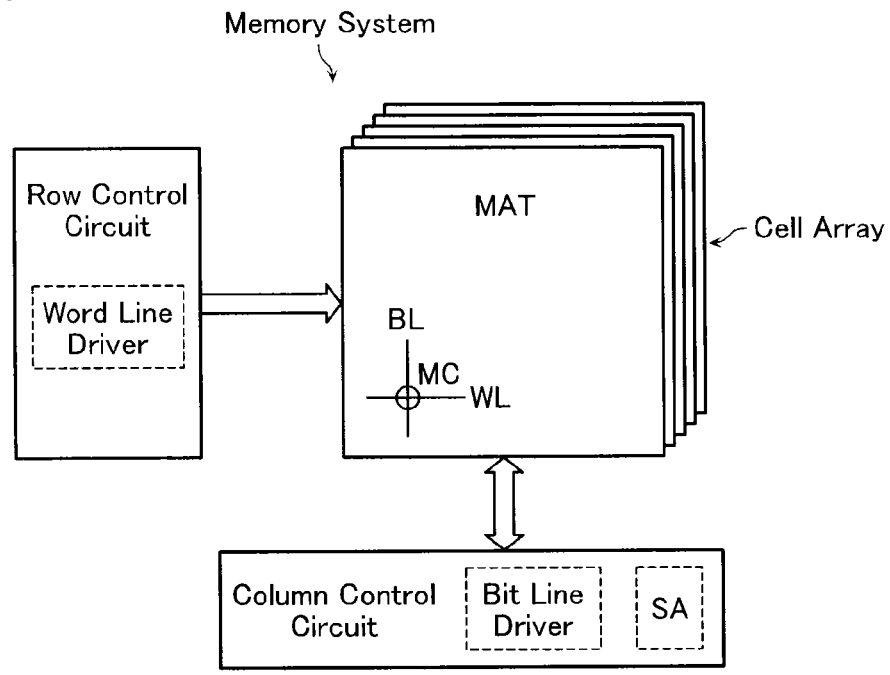
FIG. 1 is a diagram showing a configuration of a memory system according to the embodiment.

FIG. 1 is a diagram showing a configuration of the memory system according to the embodiment.

This memory system includes a cell array. The cell array includes plural unit cell arrays (hereinafter referred to as "MATS"). Each MAT has plural bit lines BL and word lines WL, and memory cells MC that can be selected by these bit lines BL and word lines WL. In the following description, the bit lines BL and word lines WL may also be called by their generic term, "selection lines". In the following description, the bit lines BL are described as first lines and the word lines WL as second lines. Note that, naturally, the word lines WL can also be described as first lines and the bit lines BL as second lines.

The bit lines BL in the cell array are electrically connected to a column control circuit, which controls the bit line BL to erase data in a memory cell MC, write data in the memory cell MC and read data out of the memory cell MC. Hereinafter, erasing data in the memory cell MC and writing data in the memory cell MC are collectively referred to as "write operation", and reading data out of the memory cell MC is referred to as "read operation". Write and read operations are collectively referred to as "access operation". In addition, a memory cell MC targeted to access operation is referred to as an "access cell", other memory cells MC as "non-access cells", selection lines and so forth connected to the access cell are referred to as "access selection lines" and so forth, and other selection lines and so forth as "non-access selection lines" and so forth. The column control circuit includes a bit line driver operative to provide the bit line BL with a potential required for access operation, and a sense amp SA operative to sense and amplify the current flowing in the memory cell MC at the time of read operation to decide the data stored in the memory cell MC.

On the other hand, the word lines WL in the cell array are electrically connected to a row control circuit, which selects the word line WL at the time of access operation. The row control circuit includes a word line driver operative to provide the word line WL with a potential required for access operation. The row control circuit is contained in an access circuit together with the column control circuit.

The memory cell MC is described next. A symbol of the memory cell MC and the terms are described as the premise.

The memory cell MC is a resistance element having an asymmetrical voltage-current characteristic like a diode.

Figure 2:
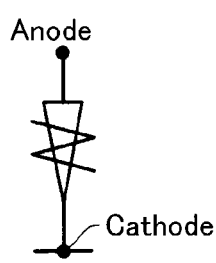
FIG. 2 is a diagram showing a circuit symbol of a memory cell in the memory system according to the embodiment.

Therefore, such a symbol that is obtained by combining the symbol of a diode and the symbol of a resister as shown in FIG. 2 is used. In this case, following a diode, the bottom side of a triangle is referred to as an "anode" and the top side as a "cathode". In addition, a bias is referred to as a "forward bias" if the potential on the anode is higher than the potential on the cathode while a bias is referred to as a "reverse bias" if the potential on the anode is lower than the potential on the cathode.

The state transitions of the memory cell MC are described next.

The memory cell MC can store data that differs in accordance with variations in the physical state or resistance state. This resistance state can be determined by the state of a metal filament formed in the memory cell MC.

The memory cell MC has a low resistance state and a high resistance state as basic resistance states. Hereinafter, the high resistance state may also be referred to as a "reset state" (first physical state) and the low resistance state as a "set state" (second physical state).

Figure 3:
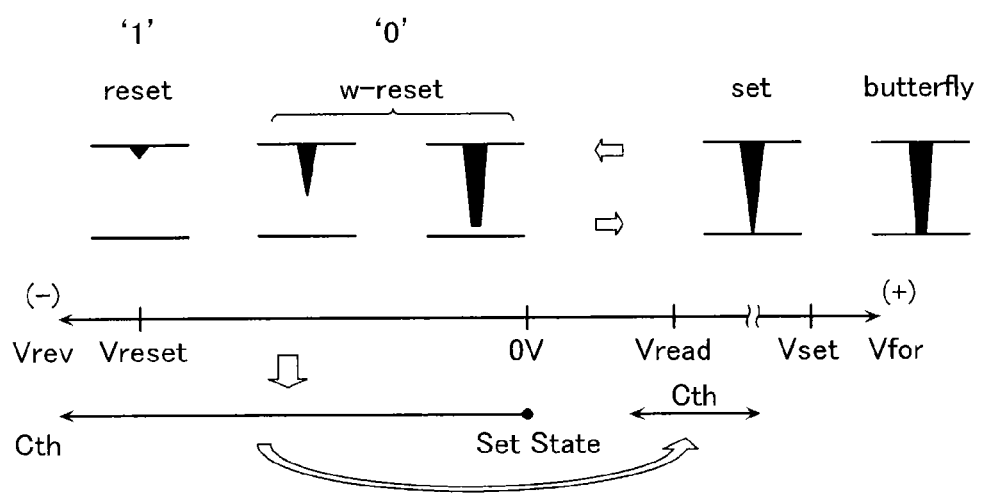
FIG. 3 is a diagram illustrative of bias applied to the memory cell and resulted threshold voltage transitions of the memory cell in the memory system according to the embodiment.

FIG. 3 is a diagram illustrative of bias applied to the memory cell and resulted threshold voltage transitions of the memory cell in the memory system according to the embodiment. This figure shows an event when the potential on the cathode is set to 0 V and the potential on the anode is varied. In the following description, the potential or voltage on the anode when the memory cell MC can be forward-biased may also be represented by "Vfor" and the potential or voltage on the anode when the memory cell MC can be reverse-biased may also be represented by "Vrev".

The metal filament is activated to develop by leaving the memory cell MC in a certain strength electric field. It requires an appropriate voltage corresponding to the state of the metal filament to be applied between the electrodes of the memory cell MC. This voltage is referred to as a "threshold voltage Cth". When a voltage exceeding the threshold voltage Cth is applied between the electrodes of the memory cell MC, the filament starts to develop and forms a conductive bridge between the electrodes in the end. Thus, the memory cell MC turns to the set state (low resistance state).

When the voltage Vrev is applied to the memory cell MC in the set state, the filament gradually resolves to become shorter. As a result, the electric field between the filament and the electrodes weakens. When the electric field weakens to a point, the filament stops to resolve. A voltage Vfor required for developing the filament again to form the conductive bridge is the threshold voltage Cth. The threshold voltage Cth almost corresponds to the state of the filament. Therefore, if the voltage Vrev applied to the memory cell MC is made larger, the filament can be resolved more. Therefore, the threshold voltage Cth becomes much larger. The threshold voltage Cth is a physical quantity indicative of the state of the memory cell MC. The memory cell MC can store data that differs in accordance with the magnitude of this physical quantity. Hereinafter, the threshold voltage Cth of the memory cell MC or the resistance state may also be referred to as a "cell state". As shown in FIG. 3, the voltage Vrev, which almost resolves the filament between the electrodes of the memory cell MC, is referred to as a "reset voltage Vreset". In reverse, the voltage Vfor, which forms a conductive bridge in the memory cell MC even if the filament is in any state, is referred to as a "set voltage Vset".

In this connection, when a voltage Vfor higher than the set voltage Vset is applied to the memory cell MC in the set state, the filament develops too thick. In this case, the filament cannot be resolved even if the voltage Vrev is applied to the memory cell MC. This state of the memory cell MC is referred to as a "butterfly state". This state means a short fault in the memory cell MC. A memory cell MC having a short fault caused by the butterfly state and so forth may also be referred to as a "short fault cell" or simply a "fault cell". In a word, in the following description, the fault cell means a short fault memory cell MC and does not mean an open fault memory cell MC as long as no special notification is given.

When a voltage Vrev smaller than the reset voltage Vreset is applied to the memory cell MC in the set state, it turns into a weak reset state (third physical state, "w-reset" in FIG. 3) in which the resistance value of the memory cell MC is still high but the threshold voltage Cth is small. In the embodiment, two states, including the above-described reset state and the weak reset state, are associated with binary information data to store data. The following description is given on the precondition that the reset state is associated with '1' and the weak reset state with '0' while the weak reset state may be associated with '1' and the reset state with '0'.

For making the memory cell MC store data distinctively, it is important to separate the threshold voltage Cth in the reset state or the set voltage Vset from the distribution of the threshold voltages Cth in the weak reset state. This is because the presence/absence of a transition of the memory cell MC to the set state, when the voltage Vfor or the read voltage Vread is applied to the memory cell MC, is used to determine if the memory cell MC is in the reset state or in the weak reset state.

In addition, the retention property of the memory cell MC is determined by the stability of the threshold voltage Cth set at the voltage Vrev. A failed operation caused at the time of data read/write to the memory cell MC is determined by a variation in the threshold voltage Cth exerted by a disturbance in the voltage Vrev caused during operation.

An appropriate voltage Vrev is applied to the memory cell MC in the set state to set the threshold voltage Cth so that this state is maintained to provide the retention of the memory cell MC. A relation between the voltage Vrev and the threshold voltage Cth is described next.

In this case, a correlation between the voltage Vrev and the threshold voltage Cth is almost one to one. When a larger voltage Vrev is applied, a threshold voltage Cth corresponding thereto can be set in the memory cell MC. In addition, in a cycle of state transitions of the memory cell MC beginning from the set state, the maximum value of the voltage Vrev or the maximum voltage Max_Vrev allows a relation Max_Vrev≈Cth to establish.

Max_Vrev=Vreset is set to the memory cell MC in the reset state as the threshold voltage Cth. This corresponds to the set voltage Vset. In a word, unless the voltage Vfor=Vset is applied to the memory cell MC, the memory cell MC makes no transition to the set state.

The retention property means holding of setting of the threshold voltage Cth. Deterioration of the retention property corresponds to a variation from '0' to '1' when the maximum voltage Max_Vrev exceeding the value at the time of setting the threshold voltage Cth is applied to the memory cell MC due to a disturbance to elevate the threshold voltage Cth, or when the resolution of the filament due to natural leaving of the memory cell MC elevates the threshold voltage Cth.

For stabilizing the threshold voltage Cth of the memory cell MC, it is required to consider such a mechanism that prevents a voltage Vrev larger than Vset/2+Vth from being applied to a non-access cell MC even in the presence of a disturbance. Then, a description is given to the influence of the threshold voltage Cth exerted from the voltage Vrev at the time of disturbing. In this case, Vth is a threshold voltage of a transistor in a driver for driving selection lines. In addition, for making the above mechanism effectively function, the threshold voltage Cth of the memory cell MC can be set so that a relation Vset≥Cth+Vset/3 can establish between the threshold voltage in the reset state, Cth=Vset, and the threshold voltage in the weak reset state, Cth (hereinafter, simply indicated "Cth" represents the threshold voltage in the weak reset state). Namely, a read margin between '0' and '1' can ensure Vset/3 at the minimum.

Figure 4:
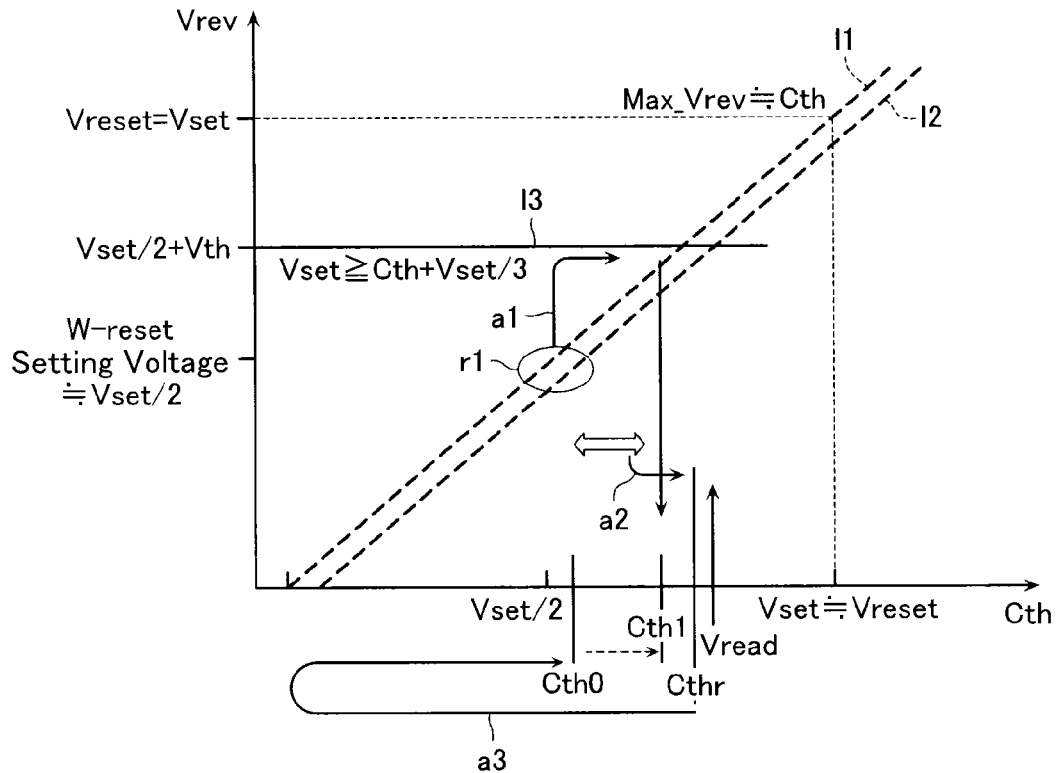
FIG. 4 is a graph showing a relation between the threshold voltage of the memory cell and the reverse bias voltage in the memory system according to the embodiment.

FIG. 4 is a graph showing a relation between the threshold voltage of the memory cell and the reverse bias voltage in the memory system according to the embodiment. This figure considers the above precondition.

A relation between the voltage Vrev along the vertical axis and the threshold voltage Cth along the lateral axis falls within a region shown by two dotted lines 11 and 12 extending at angles of around 45 degrees in the graph. In addition, a solid line 13 extending in parallel with the lateral axis indicates Vset/2+Vth. This voltage is the maximum voltage applied to the memory cell MC in the weak reset state due to a disturbance.

Setting to the weak reset state (hereinafter referred to as "weak reset setting") includes application of a weak reset voltage of around Vset/2 to the memory cell MC in the set state before access. Therefore, the threshold voltage Cth of the memory cell MC, of which weak reset state corresponds to '0', falls within a region around a voltage Cth0 shown by a solid line circle r1 in FIG. 4. This memory cell MC undergoes a disturbance even when it is not accessed but another memory cell MC is accessed. This disturbance is equal to Vset/2+Vth at the maximum, however, and accordingly the threshold voltage Cth stabilizes at a voltage Cth1 as shown by the arrow a1 in FIG. 4. Therefore, the threshold voltages Cth of the memory cell MC, of which weak reset state corresponds to '0', distribute within a region of the voltage Cth0 to the voltage Cth1. When this memory cell MC is naturally left, the threshold voltage Cth becomes much larger and slowly changes to a voltage Cthr as shown by the arrow a2 in FIG. 4.

Setting to the reset state (hereinafter referred to as "reset setting") includes application of a voltage Vrev=Vreset to the memory cell. As a result, the threshold voltage Cth of the memory cell MC is set to the set voltage Vset. The difference between the threshold voltage Cthr and the set voltage Vset becomes a margin for discriminating data. Data in the memory cell MC can be discriminated in accordance with the fact that the memory cell MC can change to the set state or not when a read voltage Vread almost the same as the threshold voltage Cthr is applied to the memory cell MC as the voltage Vfor. Once the memory cell MC changes to the set state, the threshold voltage Cth soon returns to 0 V and repeats the above cycle in an access process (see the arrow a3 shown in FIG. 4). Therefore, even if the threshold voltage Cth of the memory cell MC elevates due to natural leaving and so forth, reading can refresh the threshold voltage Cth. Accordingly, the retention property can be improved.

An access method, in which the maximum voltage Max_Vrev of the voltage Vrev applied to non-access cells MC is suppressed to Vset/2+Vth, is herein referred to as a pseudo-floating access method. Further, the floating access method is abbreviated as "FA method".

Access operation of the pseudo-FA method is described next.

Figure 5:
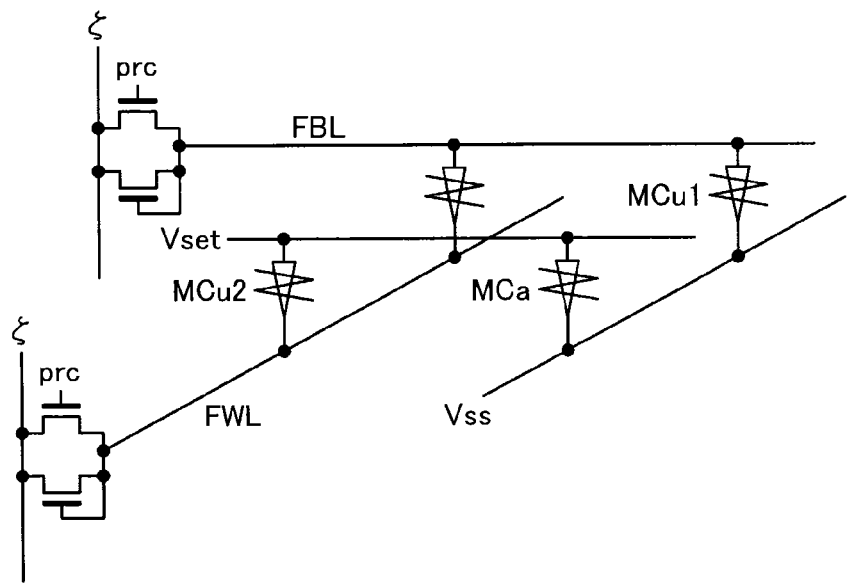
FIG. 5 is a diagram illustrative of access operation of a pseudo-FA method in the memory system according to the embodiment.

FIG. 5 is a diagram illustrative of access operation of the pseudo-FA method in the memory system according to the embodiment.

In access operation of the pseudo-FA method, when a selection line falls within a certain potential range, the driver is regarded off. In this case, potential supply from external is cut off to achieve the floating state. Access operation of the pseudo-FA method just requires relatively simple control such as setting the anode and cathode of the memory cell on the equipotential. Accordingly, the circuitry of the driver can be simplified. In addition, even in the presence of a fault cell MC, no particular potential setting is required for the purpose of preventing the influence from being exerted on access to another memory cell MC. Therefore, a redundancy system for the fault cell MC can be realized simply. From these points, the pseudo-FA method is an access method that can be easily brought into practical use, as can be said. Namely, unless access is made to a fault cell within a MAT in a cell array, the presence/absence of a short fault cannot be seen.

A selection line in a MAT can be set to an initial potential $\zeta$. In this case, even if the potential on the selection line, which is set to the potential $\zeta$ using an Nch transistor having a threshold voltage Vth provided in the driver, varies within a range of ±Vth, it can be substantially isolated from the power supply $\zeta$. Thus, a non-access selection line takes a self-aligned potential almost determined by the situation of the memory cell MC and so forth so long as it falls within the range of $\zeta$±Vth. Therefore, it is possible to utilize the merit of the FA method over variations in memory cells MC within a MAT.

Namely, even if the potential on a non-access selection line varies due to coupling with an adjacent selection line and so forth, the amount of the variation can be suppressed almost within the range of ±Vth. Therefore, even a large disturbance cannot change the cell state of the non-access cell MC.

Setting the potential $\zeta$ on selection lines FBL and FWL in a MAT can be achieved by setting a signal prc in FIG. 5 up to the potential $\zeta$+Vth or above and supplying the potential $\zeta$ directly to all selection lines.

When the signal prc is returned to the potential $\zeta$ before access, the power supply $\zeta$ is connected to selection lines ("FBL" and "FWL" shown in FIG. 5) via diode-connected Nch transistors having a threshold voltage Vth.

Selection lines having a fault cell at a cross point can be always suppressed to the potential $\zeta$±Vth unless accessed. Accordingly, no influence is exerted on other memory cells MC in the same MAT.

In addition, when access is made to a selection line connected to a fault cell MC, large current flows therein. Therefore, a fault can be specified. Thus, control can be executed so as to make no access to this selection line thereafter. These are all executed in a control circuit outside the MAT and accordingly any special design is not required to be given to the driver in the MAT.

In FIG. 5, access is made to a memory cell MCa. For making the above-described access operation of the pseudo-FA method function, it is important to maintain currents flowing in non-access cells MCu1 and MCu2 to a lower value than the leakage current when the reverse bias is applied. Therefore, it is required to show the same high resistance state as the state of the non-access cells MCu1 and MCu2 as reverse-biased so that Nch transistors having a threshold voltage Vth connected to the power supply $\zeta$ effectively function.

Then, the following description is given to a relation that should be satisfied by the threshold voltage Cth of the memory cell MC and the threshold voltage Vth of the Nch transistor.

Initially, a potential variation due to coupling between selection lines is described.

For convenience of description, several terms are defined here. Seen from the MAT, a side, on which a driver for driving an access selection line is located, is referred to as an "access side" and the opposite side as a "non-access side". In addition, the relations mutually seen from the access side and the non-access side may also be referred to as "facing sides". Further, a selection line driven by an access-side driver may also be represented as an "access-side selection line" and a selection line driven by a non-access-side driver as a "non-access-side selection line". In addition, a selection line adjacent to an access selection line of non-access-side selection lines may also be referred to as a "first adjacent selection line" and a selection line adjacent to an access selection line of access-side selection lines as a "second adjacent selection line".

Figure 6:
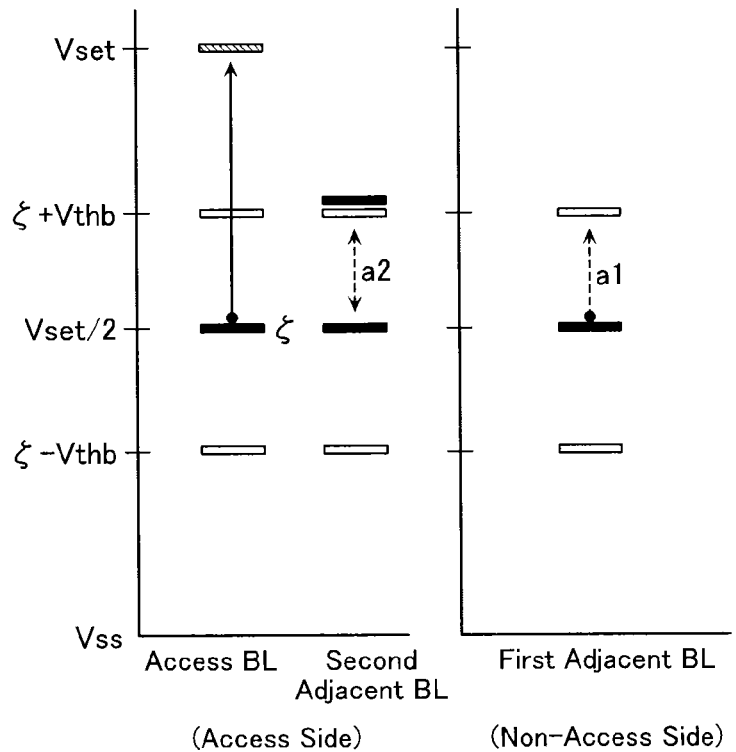
FIG. 6 is a diagram showing potential variations on bit lines at the time of set setting in the memory system according to the embodiment.
Figure 7:
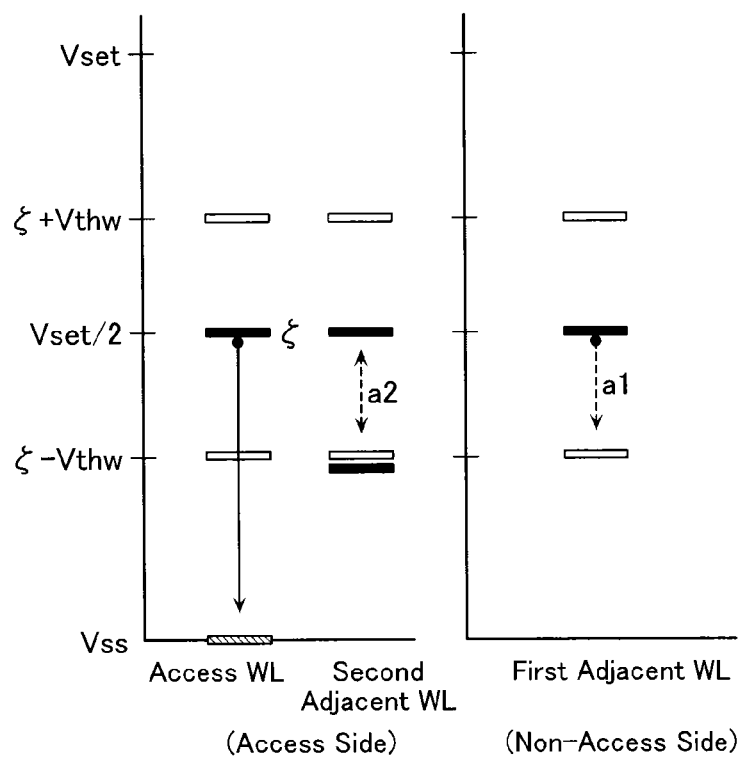
FIG. 7 is a diagram showing potential variations on word lines at the time of set setting in the memory system according to the embodiment.

FIGS. 6 and 7 are diagrams showing potential variations on selection lines at the time of set setting in the memory system according to the embodiment.

As an initial state, a potential $\zeta$ is set on selection lines in the MAT. Selection of the value of the potential $\zeta$ has certain flexibility while $\zeta$=Vset/2 is determined here. Referring here to the threshold voltage Cth of the memory cell MC, the set voltage Vset (=Vreset) is a voltage capable of almost resolving the filament when the memory cell MC is reverse-biased.

Selection lines are alternately driven from the facing sides of the MAT. Accordingly, the potentials on an access selection line and a non-access selection line adjacent thereto require different setting methods. Then, FIGS. 6 and 7 show potential variations on an access selection line, a second adjacent selection line and a first adjacent selection line. In addition, FIG. 6 shows potential variations on bit lines BL and FIG. 7 shows potential variations on word lines WL. In this case, a transistor in a driver for the bit line BL has a threshold voltage of Vthb and a transistor in a driver for the word line WL has a threshold voltage of Vthw, which are shown distinctively. These threshold voltages Vthb and Vthw may have different values or the same value. In addition, a memory cell MC in the weak reset state falls within a range that satisfies Vset≥Cth+Vset/3 and stays in a stable state having a threshold voltage Cth that can ensure a read margin relative to the set potential Vset and does not vary with respect to a disturbance. In addition, adjacent selection lines are assumed to have nearly 100% capacitive coupling therebetween.

Subsequently, the situation at the time of set setting to the access cell MC is described.

Prior to access to the MAT, all selection lines are provided with a potential of Vset/2. Therefore, starting points of potential variations on selection lines in the MAT are all at Vset/2. Subsequently, at the time of making access to the MAT, an access bit line BL is provided with the set potential Vset and an access word line WL with the ground voltage Vss. Access-side non-access selection lines are brought into the floating state and non-access-side selection lines are diode-connected to the power supply of the potential Vset/2 via transistors. Hereinafter, the state of a selection line connected to the power supply $\zeta$ (=Vset/2) via a diode-connected diode may also referred to as a "pseudo-floating state".

Selection lines are alternately driven from the facing sides of the MAT as described above. The first adjacent selection line is driven from the driver on the non-access side and therefore it turns to the pseudo-floating state. In addition, the second adjacent selection line is driven from the driver on the access side and therefore it turns to the floating state. Each selection line is surely shielded by selection lines on the facing side in a situation. Therefore, when the potential variations on the first and second adjacent selection lines at the time of access are seen, other non-access selection lines can be considered to cause no larger potential variations than the above.

The access bit line BL and the access word line WL are provided with the potential Vset/2 as shown in FIGS. 6 and 7. As a result, due to the influence of nearly 100% capacitive coupling, the potential on the first adjacent selection line changes from the potential Vset/2 as shown by the arrow a1 in FIGS. 6 and 7. This variation can be suppressed, through the diode connection to the power supply of the potential Vset/2, to around the level of the potential $\zeta$+Vth in the case of the first adjacent bit line BL and the level of the potential $\zeta$−Vth in the case of the first adjacent word line WL.

When all access-side non-access selection lines are brought into the floating state, the configuration of the access-side driver can be simplified. Then, the following description is given on the precondition that all access-side non-access selection lines are brought into the floating state. As a matter of course, depending on the driver configuration, the pseudo-floating state can be maintained in part of non-access selection lines. The first adjacent selection line is though driven from the facing side and surely brought into the pseudo-floating state. In this case, the first adjacent selection line acts as a shield and accordingly all access-side non-access selection lines can be brought into the floating state without problems.

In access-side non-access selection lines, even if these non-access selection lines are in the floating state, any disturbances larger than the potential variation on the first adjacent selection line do not appear. Therefore, the potential variations on access-side non-access selection lines fall within ranges of the arrow a2 in FIGS. 6 and 7.

A description is given to the amount of the maximum disturbance caused by the potential variation on the selection line as above and the condition for preventing failed operation.

The maximum potential caused on selection lines other than the access bit line BL is $\zeta$+Vthb as can be seen from FIG. 6. The minimum potential caused on selection lines other than the access word line WL is $\zeta$−Vthw as can be seen from FIG. 7. At this time, a disturbing forward bias applied across the memory cell MC does not exceed the threshold voltage Cth already set in the memory cell MC in a condition, which is required for preventing the threshold voltage Cth of the memory cell MC from varying and for preventing large cell current from flowing. In a word, this condition includes Vset−($\zeta$−Vthw)≤Cth between the access bit line BL and the non-access word line WL, and +Vthb)−Vss≥Cth between the non-access bit line BL and the access word line WL. A combination of these yields Vset≤2Cth−Vthb−Vthw. In addition, the condition for setting of the threshold voltage Cth includes such a margin that allows the memory cell MC in the weak reset state corresponding to '0' to satisfy Vset≥Cth+Vset/3. Therefore, Cth≤2Vset/3 leads to Vthb+Vthw≤Vset/3 and Vthb+Vthw≤Cth/2. If transistors in the driver for the bit line BL are the same as those in the driver for the word line WL, then Vthb=Vthw=Vth. Therefore, Vth≤Vset/6 and Vth≤Cth/4 provide stable operation with no variation in the threshold voltage Cth.

Subsequently, the situation at the time of reset setting to the access cell MC is described.

Figure 8:
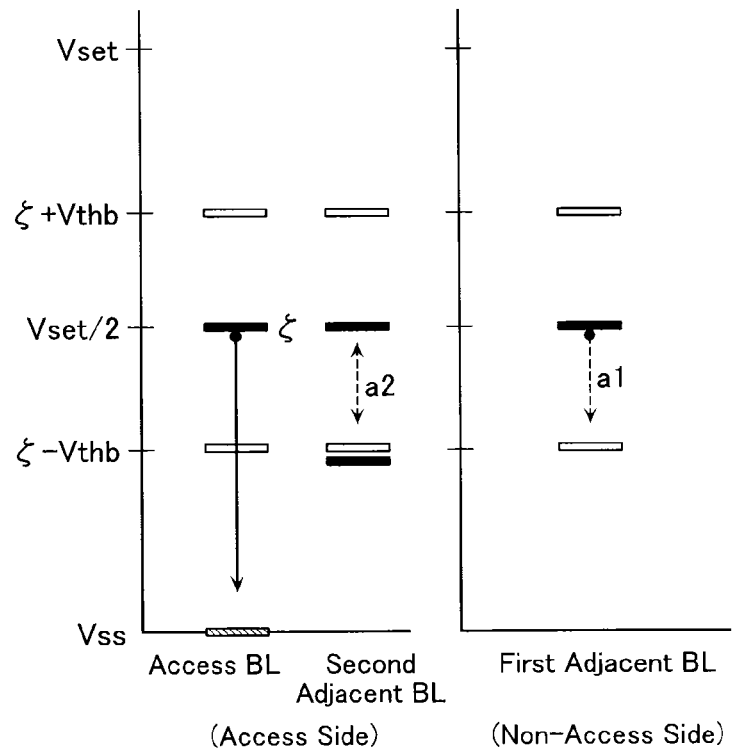
FIG. 8 is a diagram showing potential variations on bit lines at the time of reset setting in the memory system according to the embodiment.
Figure 9:
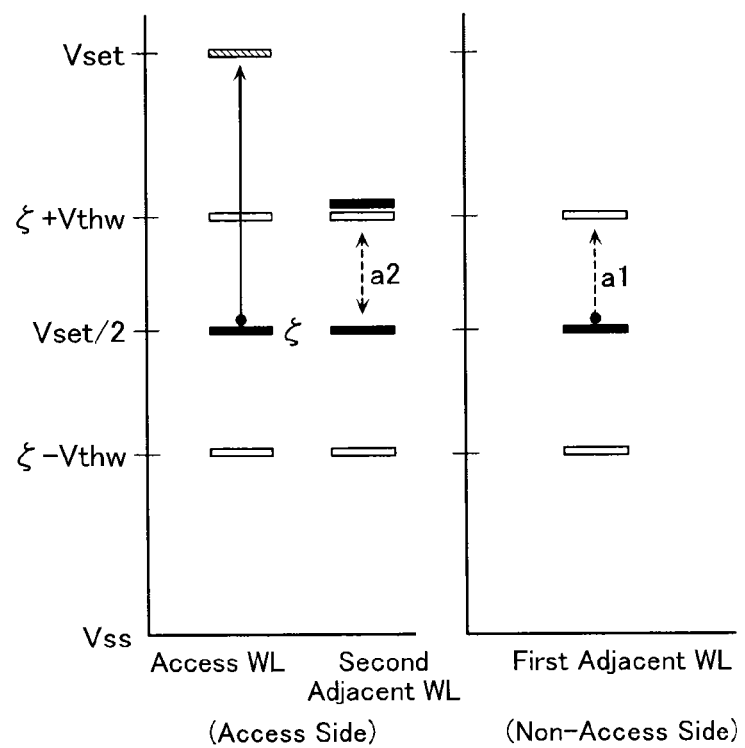
FIG. 9 is a diagram showing potential variations on word lines at the time of reset setting in the memory system according to the embodiment.

FIGS. 8 and 9 are diagrams showing potential variations on selection lines at the time of reset setting in the memory system according to the embodiment.

Prior to access to the MAT, all selection lines are provided with a potential of Vset/2. Therefore, starting points of potential variations on selection lines in the MAT are all at Vset/2. Subsequently, at the time of making access to the MAT, an access bit line BL is provided with the ground voltage Vss and an access word line WL with the set potential Vset. Access-side non-access selection lines are brought into the floating state and non-access-side selection lines are brought into the pseudo-floating state.

Selection lines are alternately driven from drivers on the facing sides of the MAT as described above. Therefore, the first adjacent selection line is driven from the driver on the non-access side and therefore it turns to the pseudo-floating state. In addition, the second adjacent selection line is driven from the driver on the access side and therefore it may completely turn to the floating state. It is though surely shielded by selection lines on the facing side in a situation. Therefore, when the potential variations on the first and second adjacent selection lines at the time of access are seen, other non-access selection lines can be considered to cause no larger potential variations than the above.

The access bit line BL and the access word line WL are provided with the potential Vset/2 as shown in FIGS. 8 and 9. As a result, due to the influence of nearly 100% capacitive coupling, the potential on the first adjacent selection line changes from the potential Vset/2 as shown by the arrow a1 in FIGS. 8 and 9. This variation can be suppressed, through the diode connection to the power supply of the potential Vset/2, to around the level of the potential $\zeta$−Vth in the case of the first adjacent bit line BL and the level of the potential $\zeta$+Vth in the case of the first adjacent word line WL.

When all access-side non-access selection lines are brought into the floating state, the configuration of the access-side driver can be simplified. Therefore, the following description is given on the precondition that all access-side non-access selection lines are brought into the floating state. As a matter of course, depending on the driver configuration, the pseudo-floating state can be maintained in part of non-access selection lines. The first adjacent selection line though acts as a shield and accordingly all access-side non-access selection lines can be brought into the floating state without problems.

In access-side non-access selection lines, even if these non-access selection lines are in the floating state, any disturbances larger than the potential variation on the first adjacent selection line do not appear. Therefore, the potential variations on access-side non-access selection lines fall within ranges of the arrow a2 in FIGS. 8 and 9.

A description is given to the amount of the maximum disturbance caused by the potential variation on the selection line as above and the condition for preventing failed operation.

The minimum potential caused on selection lines other than the access bit line BL is $\zeta$−Vthb as can be seen from FIG. 8. The maximum potential caused on selection lines other than the access word line WL is $\zeta$+Vthw as can be seen from FIG. 9. At this time, a disturbing reverse bias applied across the memory cell MC does not exceed the threshold voltage Cth already set in the memory cell MC in a condition, which is required for preventing the memory cell MC from varying the cell state. In a word, this condition includes Vset−($\zeta$−Vthb)≤Cth between the access word line WL and the non-access bit line BL, and ($\zeta$+Vthw)−Vss≤Cth between the non-access word line WL and the access bit line BL. A combination of these yields Vset≤2Cth−Vthb−Vthw. In addition, the condition for setting of the threshold voltage Cth includes such a margin that allows the memory cell MC in the weak reset state corresponding to '0' to satisfy Vset≥Cth+Vset/3. Therefore, Cth≤2Vset/3 leads to Vthb+Vthw≤Vset/3 and Vthb+Vthw≤Cth/2. If transistors in the driver for the bit line BL are the same as those in the driver for the word line WL, then Vthb=Vthw=Vth. Therefore, Vth≤Vset/6 and Vth≤Cth/4 provide stable operation with no variation in the threshold voltage Cth.

This condition is the same as that for the above-described set setting.

The following description is given to the procedure of potential setting in the pseudo-FA method.

This procedure includes setting of $\zeta$(≈Vset/2) on selection lines in the MAT as the initial potential. This is one of the characteristics.

The herein-described procedure in the pseudo-FA method comprises four steps, including a hold step, an initial step, a standby step and an active step.

Figure 10:
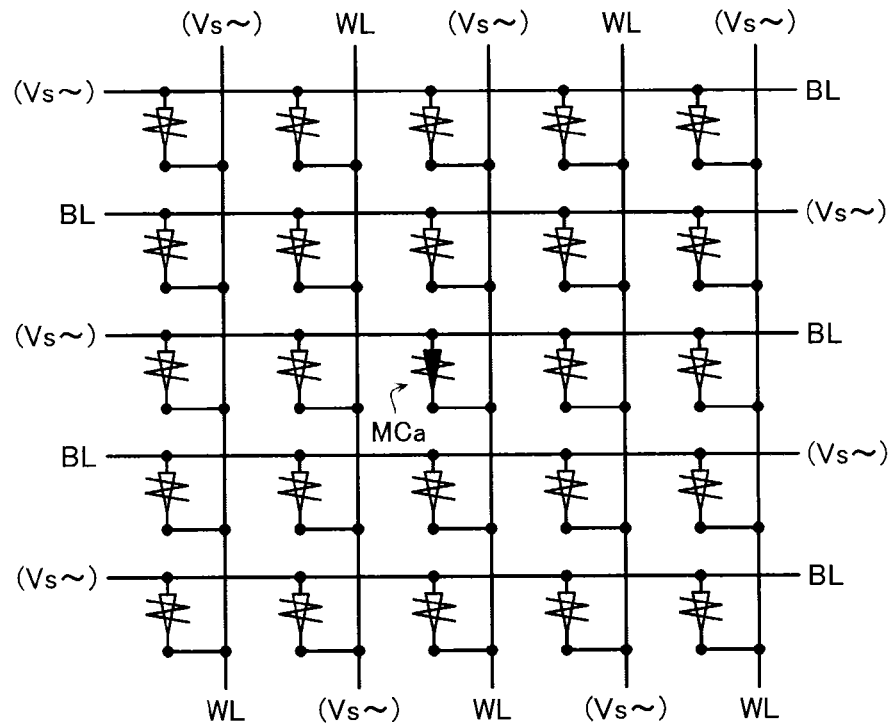
FIG. 10 is a diagram showing a bias state of a cell array at the hold step in the pseudo-floating access method in the memory system according to the embodiment.

FIG. 10 is a diagram showing a bias state of a cell array (MAT) at the hold step in the pseudo-FA method in the memory system according to the embodiment.

The hold step is a step at the time of maintaining the cell state of the memory cell MC and leaving the memory system. At the hold step, all selection lines in the MAT are maintained on a floating potential of externally given Vs~ almost near the ground potential Vss. Hereinafter, a floating potential is indicated with the addition of '~'. The memory cell MC is not biased forcibly. Therefore, the retention time of the cell state of the memory cell MC follows the natural transition voluntarily caused by the cell itself. In the embodiment, if the retention time is shorter than that required by the specification, a method is applied for apparently extending it. This method is described later.

Figure 11:
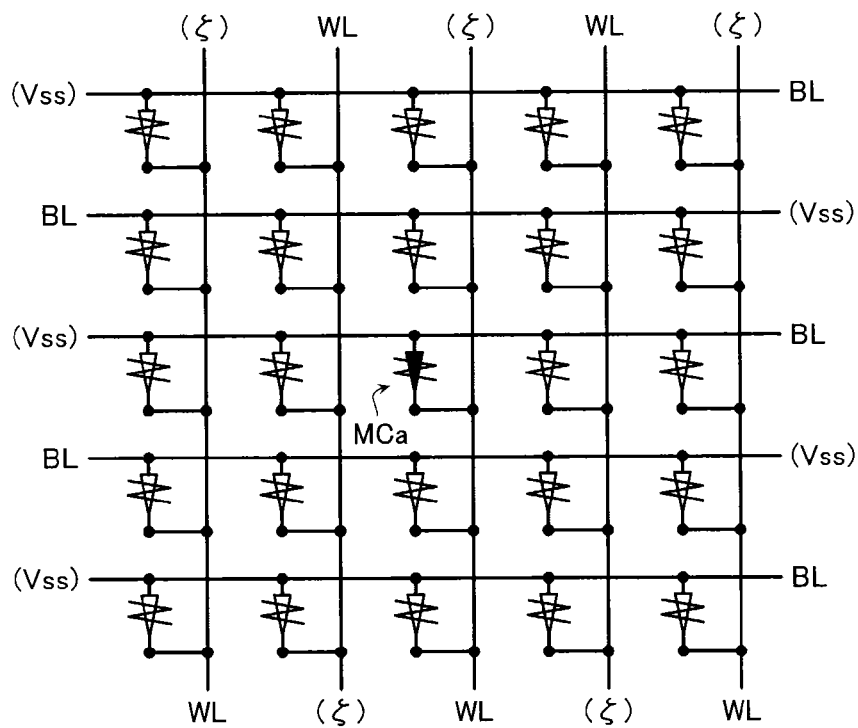
FIG. 11 is a diagram showing a bias state of the cell array at the initial step in the pseudo-floating access method in the memory system according to the embodiment.

FIG. 11 is a diagram showing a bias state of a memory cell array (MAT) at the initial step in the pseudo-FA method in the memory system according to the embodiment.

The initial step is a step previously executed for entering access operation. It is a step of subjecting the threshold voltages Cth in the weak reset state having history-caused variations, of the reset state corresponding to '1' and the weak reset state corresponding to '0', to alignment within a range of certain values so as to eliminate extremely small ones. Namely, a certain reverse bias is applied to all memory cells MC contained in the MAT to change memory cells MC in the set state to the weak reset state having threshold voltages Cth within a certain range. Memory cells MC in the reset state have threshold voltages of Cth≈Vset and accordingly stay in the reset state without variations in the threshold voltages Cth.

At the initial step, the memory cell MC is reverse-biased so as to satisfy Vset≥Cth+Vset/3, that is, 2Vset/3≥Cth so that the reset state corresponding to '1' and the weak reset state corresponding to '0' of the memory cell MC can be separated leaving a margin. Namely, the reverse bias applied across the memory cell MC and the threshold voltage Cth in the set state have an almost proportional correlation therebetween. In this case, if the voltage of the reverse bias is $\zeta$, the threshold voltage Cth can be lowered to 2Vset/3 or below by lowering the voltage $\zeta$ to 2Vset/3 or below. Therefore, in the interest of simplicity, the potential $\zeta$=Vset/2 is given. In this connection, at this time, the threshold voltage becomes Cth≈Vset/2. Therefore, the threshold voltage Vth of transistors in the driver is set so that Vth≤Vset/6 and Vth≤Cth/4 yield Vth≤Vset/3. If $\zeta$=2Vset/3, then Vth≤Vset/6. Specifically, all word lines WL in the MAT are provided with the potential $\zeta$ and all bit lines BL in the MAT are provided with the ground potential Vss.

Subsequently, the control enters the standby step.

Figure 12:
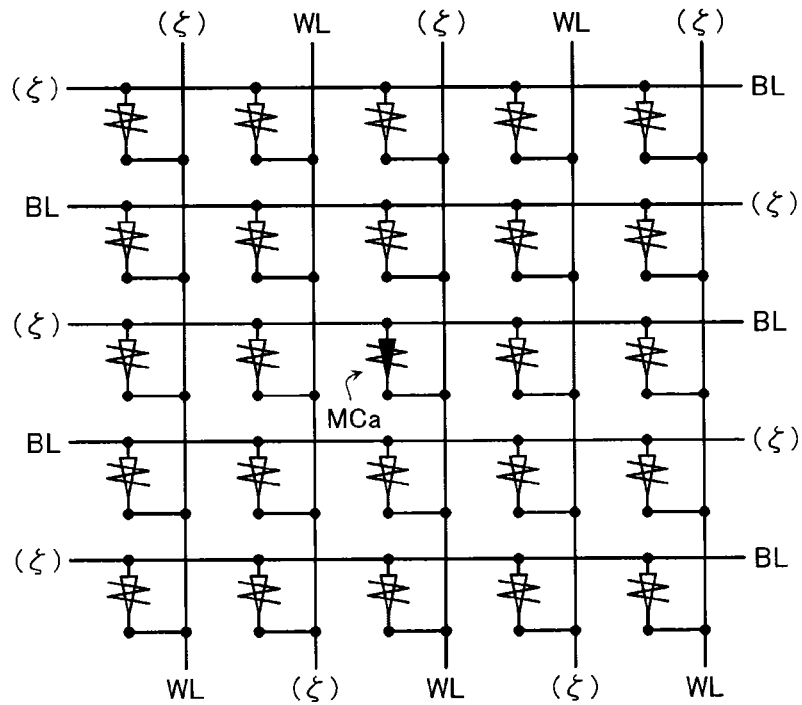
FIG. 12 is a diagram showing a bias state of the cell array at the standby step in the pseudo-floating access method in the memory system according to the embodiment.

FIG. 12 is a diagram showing a bias state of the memory cell array (MAT) at the standby step in the pseudo-FA method in the memory system according to the embodiment.

The standby step is a step of setting potentials on the MAT before actual access to the memory cell MC. It is one of steps in access operation. At the standby step, an initial value of the potential variation on each selection line, that is, the potential $\zeta$ is directly set. Therefore, all selection lines in the MAT are provided with a potential ζ (for example, Vset/2) directly from drivers.

Subsequently, the active step is described.

Figure 13:
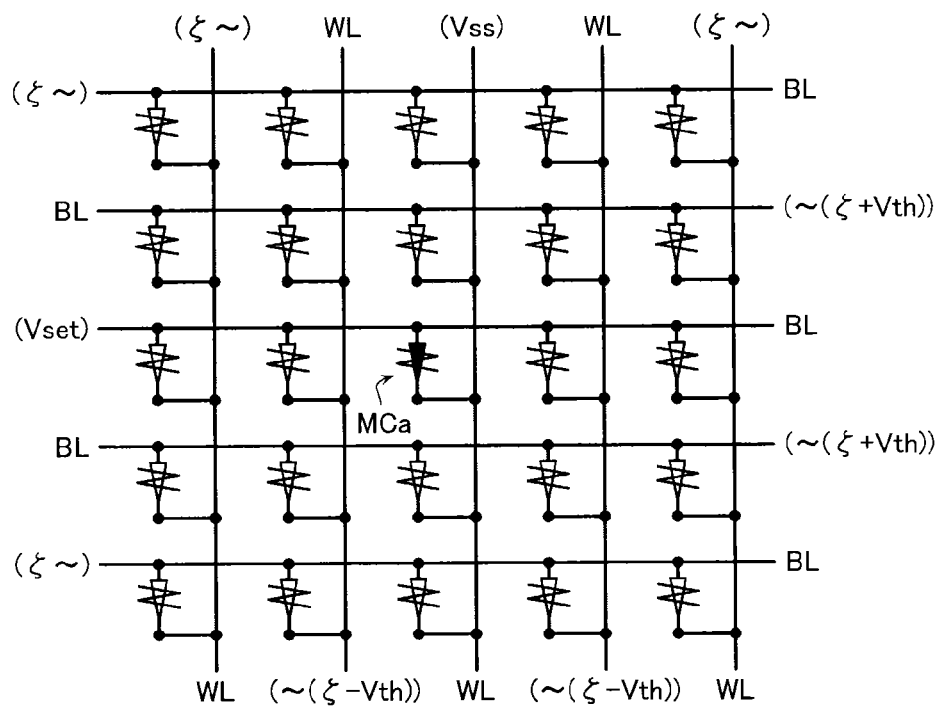
FIG. 13 is a diagram showing a bias state of the cell array at the active step in the pseudo-floating access method in the memory system according to the embodiment.

FIG. 13 is a diagram showing a bias state of the cell array at the active step in the pseudo-FA method in the memory system according to the embodiment.

The active step is a step executed immediately after the standby step. It is a step of making actual access to the access cell MC. The active step is one of steps in access operation. At the active step, plural bit lines BL and one word line WL in the MAT are used as access selection lines to make access to a memory cell MC located on a cross point between these access selection lines. In FIG. 13, access is made to one black-colored memory cell MCa of 5×5 memory cells in the cell array of the MAT. As described above, selection lines in the MAT are driven alternately from drivers on the facing sides. The selection lines are driven only from drivers on the access side. Therefore, the access-side selection lines are brought into the floating state to down-size the circuit scale of drivers. Further, the non-access-side selection line for driving the first adjacent selection line is connected to the power supply ζ by turning on the transistor in the non-access-side driver. Therefore, as shown in FIGS. 6 and 7 used in describing the disturbance at the time of former set operation, the access bit line BL is provided with the set potential Vset and the access word line WL with the ground potential Vss. Assuming that capacitive coupling between adjacent selection lines is almost 100%, the first adjacent bit line BL has a potential ζ+Vth and the first adjacent word line WL has a potential ζ−Vth. Further, as the second adjacent selection lines are brought into the floating state, they turn to the floating state of the potential ζ, that is, ζ~. In a word, the potentials on bit lines BL and word lines WL in the MAT distribute within a range of ζ+Vth to ζ−Vth.

In the case of the above-described pseudo-FA method, even in the presence of a short fault in the MAT, bit lines BL and word lines WL are on the equipotential at the standby step, and so long as no access is made to a fault cell at the active step, it can be handled like other selection lines in the floating state through diode-connected transistors without problems. At the initial step, however, all memory cells MC in the MAT are reverse-biased and accordingly the presence of a plurality of fault cells causes a large current flow. This current can be used at a circuit provided to forcibly set the selection line having a fault cell to the equipotential in a method. Hereinafter, a description is given to a pseudo-FA method capable of omitting the above circuit to further simplify the peripheral circuits around the MAT.

The following description is given to the procedure of potential setting in the pseudo-FA method in the presence of a fault cell.

This procedure is characterized in precluding a fault that exerts an influence on a non-access cell MC and leaving a fault that exerts no influence even if it increases the current consumption. It is also characterized in detecting a fault immediately before the active step, weak reset setting at the final stage of the active step, and suppressing excessive weak reset setting at the end of the active step.

The procedure of the pseudo-FA method herein described includes a hold step, a standby step, an active initial step, an active step and an active final step. Further, in this case the active step has a set phase and a reset phase.

Initially, the hold step is described.

Figure 14:
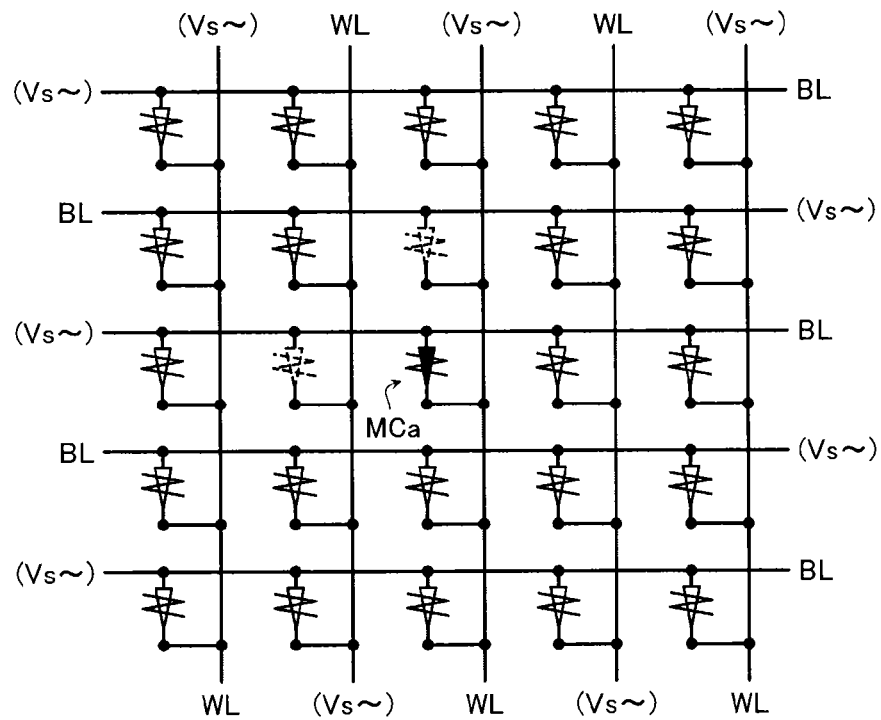
FIG. 14 is a diagram showing a bias state of the cell array at the hold step in the pseudo-floating access method in the memory system according to the embodiment.

FIG. 14 is a diagram showing a bias state of the cell array (MAT) at the hold step in the pseudo-FA method in the memory system according to the embodiment. A memory cell MC shown by the dotted lines in the figure is a fault cell. The same goes for FIGS. 15-19.

The hold step is a step at the time of maintaining the cell state of the memory cell MC and leaving the memory system. At the hold step, all selection lines in the MAT are maintained on a floating potential of externally given Vs~ almost near the ground potential Vss. The memory cell MC is not biased forcibly. Therefore, the retention time of the cell state of the memory cell MC follows the natural transition voluntarily caused by the cell itself. In the embodiment, if the retention time is shorter than that required by the specification, a method is applied for apparently extending it. This method is described later.

Subsequently, the standby step is described.

Figure 15:
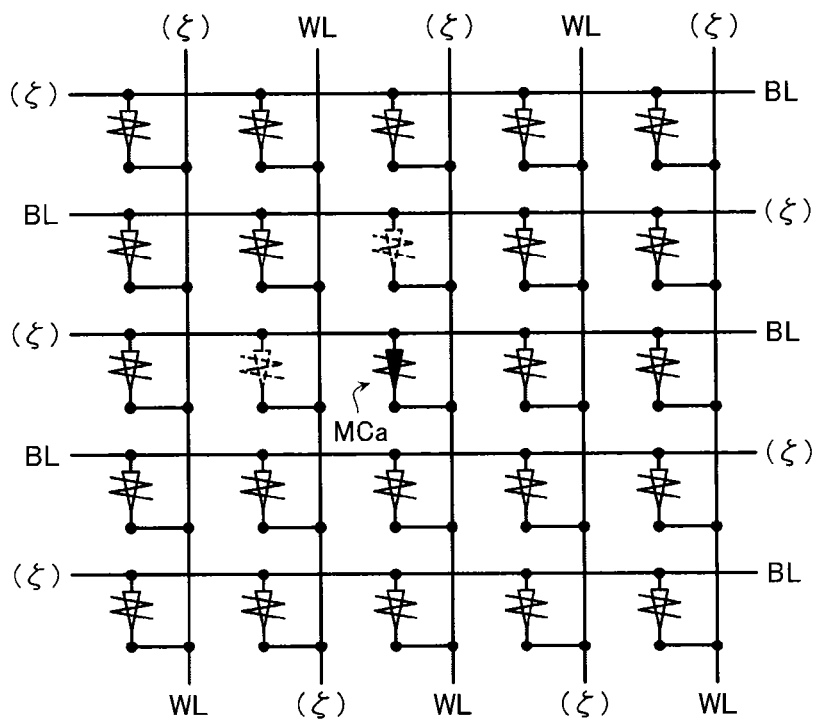
FIG. 15 is a diagram showing a bias state of the cell array at the standby step in the pseudo-floating access method in the memory system according to the embodiment.

FIG. 15 is a diagram showing a bias state of the cell array (MAT) at the standby step in the pseudo-FA method in the memory system according to the embodiment.

The standby step is a step of setting potentials on the MAT before actual access to the memory cell MC. It is one of steps in access operation. At the standby step, an initial value of the potential variation on each selection line, that is, the potential ζ is directly set. Therefore, all selection lines in the MAT are provided with a potential ζ (for example, Vset/2) directly from drivers.

Subsequently, the active initial step is described.

Figure 16:
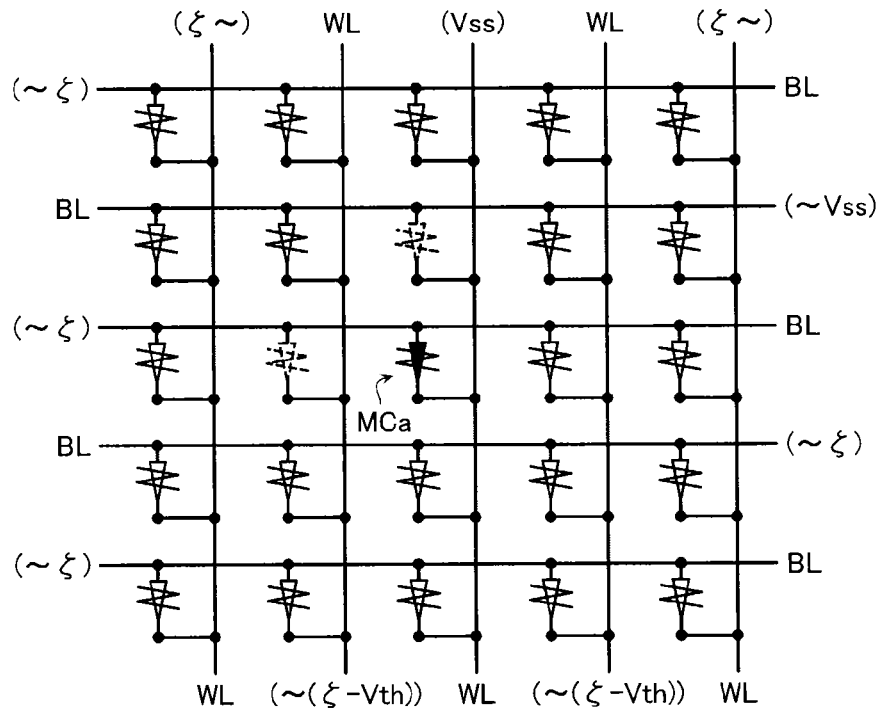
FIG. 16 is a diagram showing a bias state of the cell array at the active initial step in the pseudo-floating access method in the memory system according to the embodiment.

FIG. 16 is a diagram showing a bias state of the cell array (MAT) at the active initial step in the pseudo-FA method in the memory system according to the embodiment.

The active initial step is a step executed immediately after the standby step. It is one of steps in access operation. At the active initial step, a fault that exerts an influence on another memory cell MC is precluded. If fault cells exist on both of the access bit line BL and the access word line WL, disturbances appear on the set potential Vset in the MAT. Therefore, the fault on either of the access bit line BL and the access word line WL is precluded. As plural bit lines BL are accessed in parallel, it is difficult to specify the bit line BL connected to the fault cell. In contrast, it is easy to specify the word line WL connected to the fault cell because only one is accessed in the MAT. Therefore, the fault cell on the word line WL is precluded.

At the active initial step, bit lines BL are all brought into the pseudo-floating state and, as for word lines WL, the access word line WL is provided with the ground potential Vss. In addition, non-access-side non-access word lines WL are brought into the pseudo-floating state and access-side non-access word lines WL are brought into the floating state. If a fault cell exists on the access word line WL at this setting, the bit line BL connected to this fault cell is pulled down to the ground potential Vss. As a result, constant current flows in the bit line BL in the pseudo-floating state via a transistor in the driver. Therefore, when the value of current in the power supply of the potential ζ is monitored, constant current flows continuously also after transient current. If no fault cell exists on the access word line WL, no large current other than transient current flows because of the threshold voltage Cth of the memory cell MC. Therefore, the presence/absence of a fault cell can be decided. If current flows continuously, the presence of a fault cell is decided and access to the word line WL is avoided thereafter. This avoidance can be realized by storing the address in a controller or a peripheral circuit, or redundancy-replacing with a spare word line WL. In the case of a mass-storable memory system, though, it is also possible to avoid a fault and make no access.

Subsequently, the set phase at the active step is described.

Figure 17:
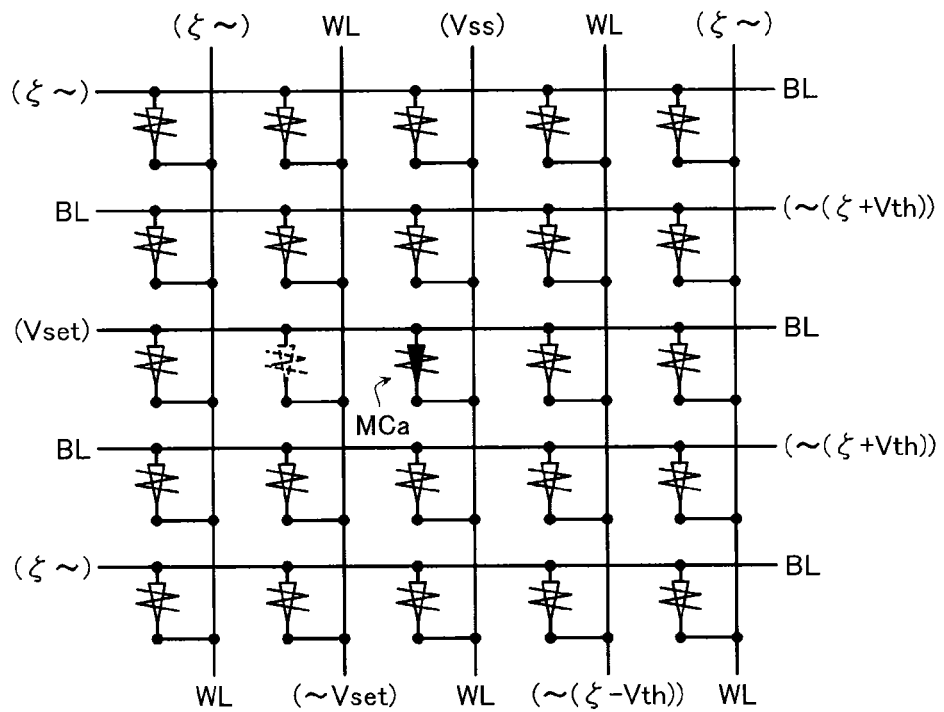
FIG. 17 is a diagram showing a bias state of the cell array in the set phase at the active step in the pseudo-floating access method in the memory system according to the embodiment.

FIG. 17 is a diagram showing a bias state of the cell array (MAT) in the set phase at the active step in the pseudo-FA method in the memory system according to the embodiment.

The set phase is a phase for avoiding a fault and making access to a word line WL having no fault. The active step is one of steps in access operation.

In the set phase, the access bit line BL is provided with the set potential Vset. On the other hand, the access word line WL is continuously provided with the ground potential Vss already set at the active initial step. In addition, access-side non-access bit lines BL are brought into the floating state and non-access-side non-access bit lines BL are brought into the pseudo-floating state. The first adjacent bit line BL is driven from the non-access side and accordingly it stays on the potential of around $\zeta$+Vth even in the presence of nearly 100% capacitive coupling. On the other hand, the first adjacent word line WL is in the pseudo-floating state and accordingly it is around $\zeta$−Vth. In the presence of a fault cell on the access bit line BL, though, it elevates up to around the set potential Vset. In the presence of a fault cell on the word line WL in the pseudo-floating state, extra current flows but does not change the cell state of the non-access cell MC. The details of this point are described later. The cell current in the access cell MC cannot be grasped correctly because of the fault-caused leakage current. Therefore, failed write and failed read easily occur. This point can be supported by an ECC and so forth executed in peripheral circuits.

Read operation from the access cell MC is executed in the same processing as that in the set phase at the active step by providing the bit line BL with the read potential Vread instead of the set potential Vset and monitoring the current flowing at that time.

Subsequently, the reset phase at the active step is described.

Figure 18:
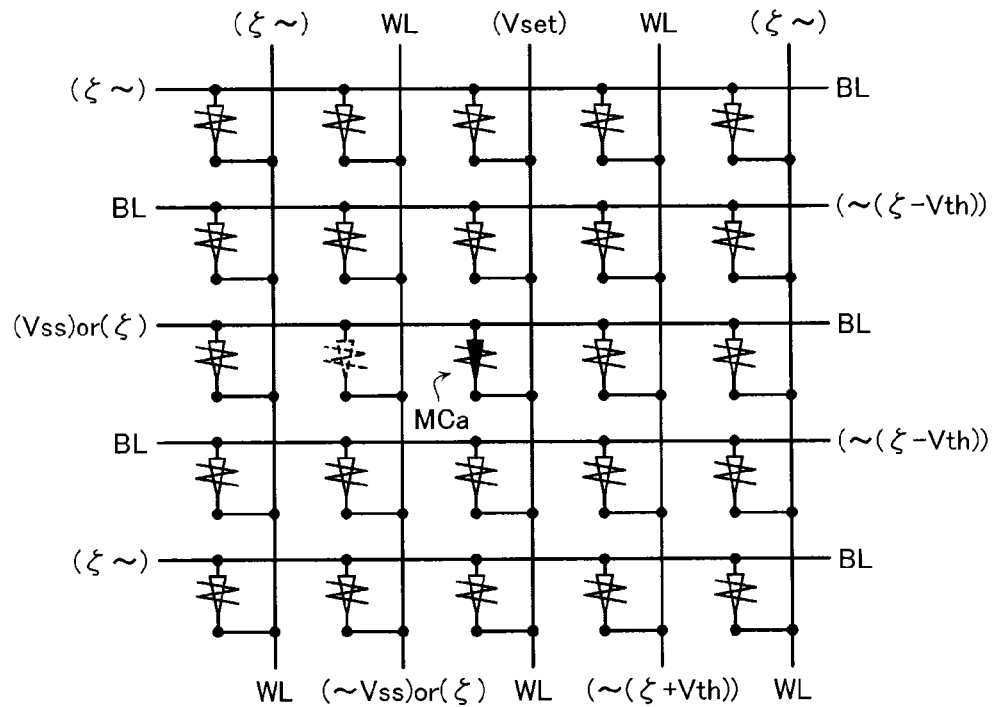
FIG. 18 is a diagram showing a bias state of the cell array in the reset phase at the active step in the pseudo-floating access method in the memory system according to the embodiment.

FIG. 18 is a diagram showing a bias state of the cell array (MAT) in the reset phase at the active step in the pseudo-FA method in the memory system according to the embodiment. This reset phase is provided to execute the processing of weak reset setting in the case of read operation also.

The reset phase is a phase for executing reset setting to the access cell MC. In the reset phase, the access word line WL is provided with the set potential Vset and the access bit line BL with the ground potential Vss. As for other selection lines, following the above set phase, access-side non-access selection lines are brought into the floating state and non-access-side non-access selection lines are brought into the pseudo-floating state. The potential on the first adjacent bit line BL is around $\zeta$−Vth even in the presence of nearly 100% capacitive coupling between adjacent lines, and the potential on the first adjacent word line WL is around $\zeta$+Vth. The potential on the non-access word line WL connected to the fault cell connected to the access bit line BL is, however, pulled down to the ground potential Vss. Therefore, extra current flows in selection lines in the MAT though it does not cause a disturbance sufficient to change the state of the non-access cell MC. The details of this point are described later. If there is a plurality of fault cells, the ground potential Vss set on the access bit line BL rises. Accordingly, sufficient reset setting cannot be executed and thus failed write easily occurs. This point can be supported by an ECC and so forth executed in peripheral circuits.

At the end of the reset phase, the set-setting-executed memory cell MC is subjected to weak reset setting. As a result, the threshold voltage Cth of the memory cell MC is set to correction to change the resistance state of the memory cell MC to a high resistance. Therefore, in the reset phase, those access bit lines other than the access bit line BL connected to the reset-setting-executed memory cell MC are provided with not the ground potential Vss but the potential $\zeta$. Thus, the set-setting-executed memory cell MC can be changed to the weak reset state. In this case, if a fault cell exists on the bit line BL connected to the set-setting-executed memory cell MC, the word lines WL connected to the fault cell are pulled down to the potential $\zeta$. The potentials on these word lines WL, however, fall within a range of potential setting in the pseudo-floating state without problems.

Subsequently, the active final step is described.

Figure 19:
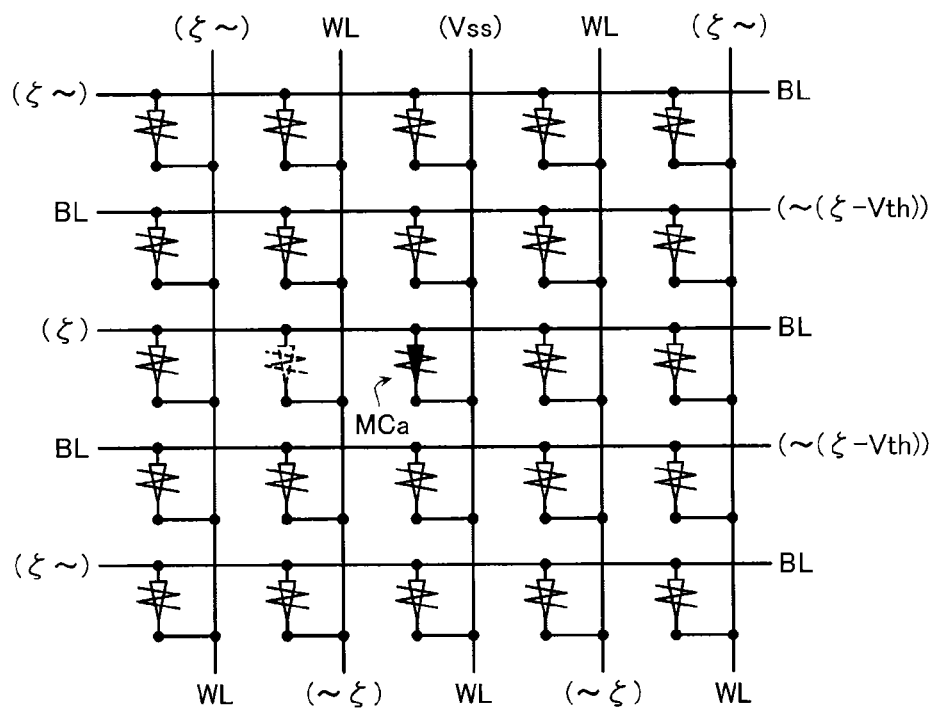
FIG. 19 is a diagram showing a bias state of the cell array at the active final step in the pseudo-floating access method in the memory system according to the embodiment.

FIG. 19 is a diagram showing a bias state of the cell array (MAT) at the active final step in the pseudo-FA method in the memory system according to the embodiment.

The active final step is a step of suppressing increases in the threshold voltage Cth of the memory cell MC in the weak reset state. It is one of steps in access operation. This is for the following reason. When reverse bias disturbances are applied several times across the memory cell MC in the weak reset state, the resultant influence increases the threshold voltage Cth such that it may possibly change to the reset state in the end. At the active final step, all access bit lines BL are provided with the potential $\zeta$ and the access word line WL with the ground potential Vss. Thus, the memory cell MC on the access word line WL is forward-biased so that the increase in the threshold voltage Cth of the memory cell MC in the weak reset state can be suppressed.

After completion of the active final step, processing at the hold step and the standby step is executed again to prepare the next cycle.

The following description is given to potential variations on selection lines caused by influences of fault cells and capacitive coupling between selection lines.

Figure 20:
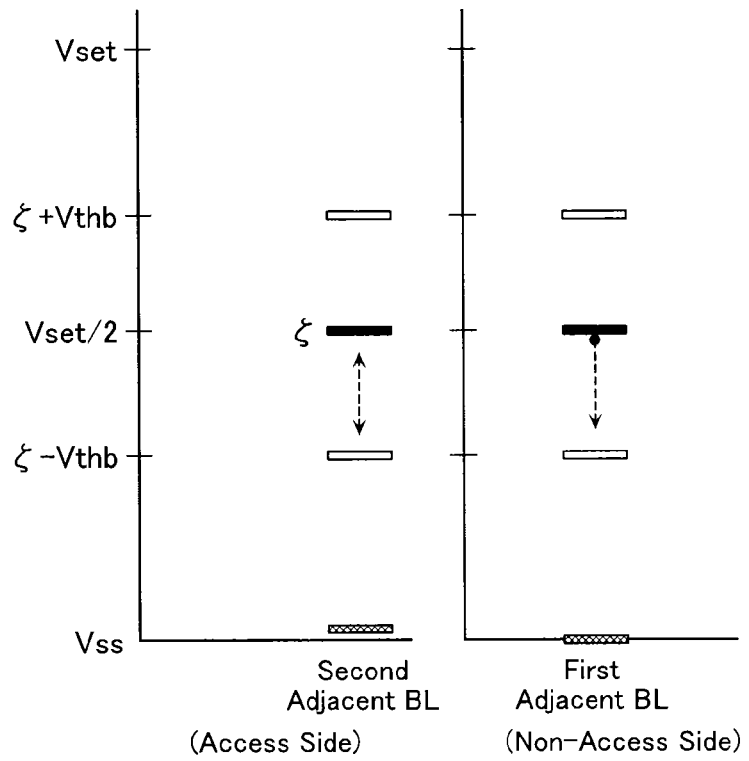
FIG. 20 is a diagram showing potential variations on bit lines at the active initial step in the pseudo-floating access method in the memory system according to the embodiment.
Figure 21:
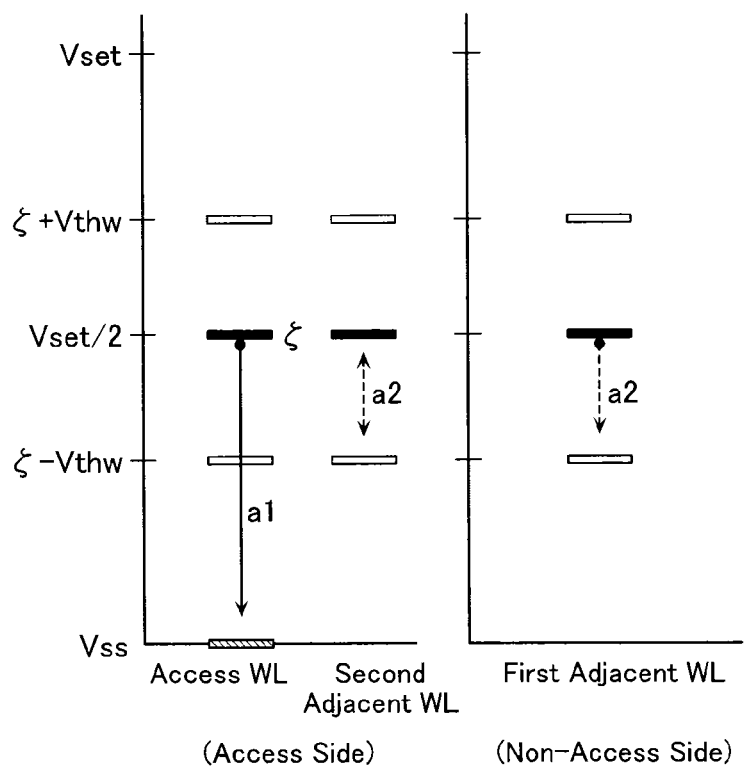
FIG. 21 is a diagram showing potential variations on word lines at the active initial step in the pseudo-floating access method in the memory system according to the embodiment.

FIGS. 20 and 21 are diagrams showing potential variations on bit lines at the active initial step in the memory system according to the embodiment.

As an initial state, a potential is set on selection lines in the MAT. Selection of the value of the potential $\zeta$ has certain flexibility while $\zeta$=Vset/2 is determined here. Referring here to the threshold voltage Cth of the memory cell MC, the set potential Vset (=Vreset) is a voltage capable of almost resolving the filament when the memory cell MC is reverse-biased.

Initially, at the active initial step for detecting a fault cell on a word line WL to avoid it, bit lines BL are all brought into the pseudo-floating state and linked to the power supply of the potential $\zeta$=Vset/2.

In access to word lines WL, setting of the same driver operation as that in the normal access is executed so that all access-side non-access word lines WL are in the floating state and non-access-side non-access word lines are in the pseudo-floating state. The potential on the access word line WL varies from the potential $\zeta$ to the ground potential Vss as shown by the arrow a1 in FIG. 21. Therefore, as for non-access word lines WL, potentials on non-access word lines WL distribute within a range of $\zeta$ to $\zeta$−Vth as shown by the arrow a2 in FIG. 21. Potentials on bit lines BL, drawing no distinction between access bit lines BL and non-access bit lines BL, are pulled down almost to the ground potential Vss in the presence of a fault cell on the access word line WL as shown in FIG. 20. In a bit line BL connected to the fault cell, certain current flows via a diode-connected transistor. If the certain current continues for awhile, the presence of the fault cell on the access word line WL can be decided. Accordingly, it is controlled not to make access to this word line WL.

After completion of set setting to the memory cell MC, the memory cell MC is reverse-biased with around Vset/2 and changed to the weak reset state. In this case, the threshold voltage Cth of the memory cell MC in the weak reset state falls within a range that satisfies Vset≥Cth+Vset/3, and stays in a stable state with the threshold voltage Cth that can ensure a read margin relative to the set potential Vset and does not vary with respect to a disturbance.

Then, the following description is given to the situation in the set phase at the active step of executing set setting to the access cell MC.

Figure 22:
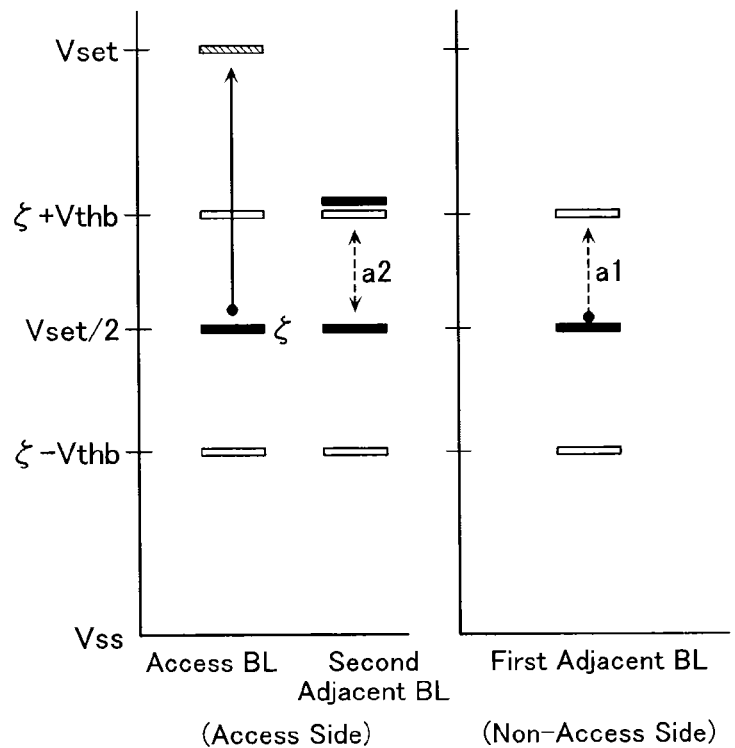
FIG. 22 is a diagram showing potential variations on bit lines in the set phase at the active step in the pseudo-floating access method in the memory system according to the embodiment.
Figure 23:
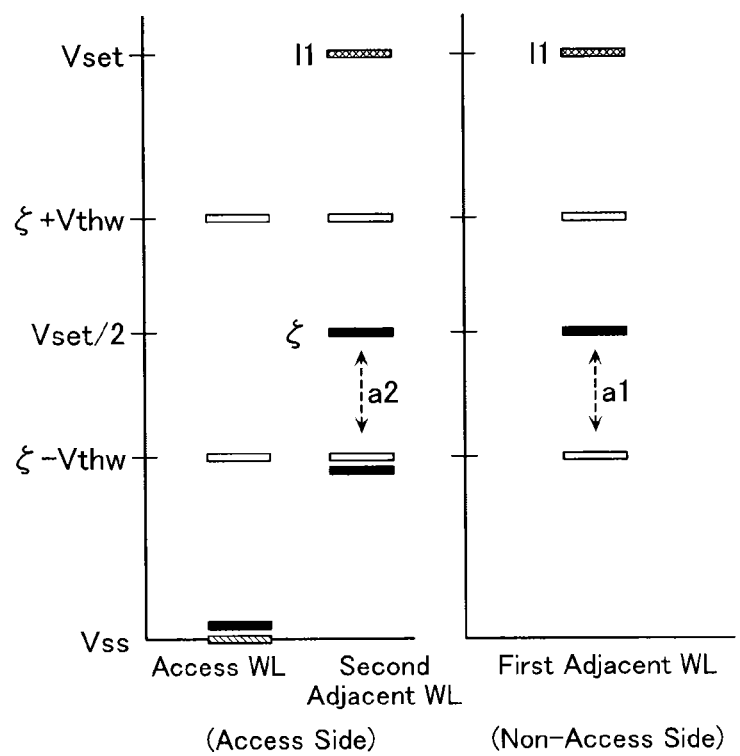
FIG. 23 is a diagram showing potential variations on word lines in the set phase at the active step in the pseudo-floating access method in the memory system according to the embodiment.

FIGS. 22 and 23 are diagrams showing potential variations on selection lines in the set phase at the active step in the memory system according to the embodiment.

When potential setting is executed following the active initial step, the potential on the bit line BL starts from Vset/2 and the potential on the word line WL remains as it is at the active initial step.

Subsequently, once the control enters the set phase, the access bit line BL is provided with the set potential Vset while access-side non-access bit lines BL are in the floating state and non-access-side non-access bit lines BL are in the pseudo-floating state.

Selection lines are driven alternately from the drivers on the facing sides in the MAT. Therefore, the first adjacent selection line is not accessed from the driver on the non-access side and accordingly it turns to the pseudo-floating state. In addition, the second adjacent selection line is driven from the driver on the access side and accordingly it turns to the floating state. It is, however, surly shielded by selection lines on the facing side in a situation. Therefore, when the potential variations on the first and second adjacent selection lines at the time of access are seen, other non-access selection lines can be considered to cause no larger potential variations than the above.

The access bit line BL and the access word line WL are provided with the potential Vset/2 as shown in FIGS. 22 and 23. As a result, due to the influence of nearly 100% capacitive coupling, the potential on the first adjacent selection line changes from the potential Vset/2 as shown by the arrow a1 in FIGS. 22 and 23. This variation can be suppressed, through the diode connection to the power supply of the potential Vset/2, to around the level of the potential ζ+Vth in the case of the first adjacent bit line BL and the level of the potential ζ−Vth in the case of the first adjacent word line WL.

In this case, all access-side non-access selection lines are brought into the floating state. In addition, if a fault cell exists on the access bit line BL, it exerts an influence such that the potential on the non-access word line WL connected to the fault cell is pulled up to the set potential Vset via the fault cell as shown by the thick line 11 in FIG. 23.

A non-access selection line, even if it is in the floating state, causes no disturbance larger than the potential variation on the first adjacent selection line. Therefore, the potential on the access-side floating-state selection line just varies within a range shown by the arrow a2 in FIGS. 22 and 23. The variation in the potential shown by the thick line 11 in FIG. 23 is limited to the non-access word line WL connected to the fault cell.

A description is given to the amount of the maximum disturbance caused by the potential variation on the selection line as above and the condition for preventing failed operation.

The maximum potential caused on selection lines other than the access bit line BL is ζ+Vthb as can be seen from FIG. 22. The minimum potential caused on selection lines other than the access word line WL is ζ−Vthw as can be seen from FIG. 23. At this time, a disturbing forward bias applied across the memory cell MC does not exceed the threshold voltage Cth already set in the memory cell MC in a condition, which is required for preventing the memory cell MC from changing the cell state and for preventing large cell current from flowing. In a word, this condition includes Vset−(ζ−Vthw)≤Cth between the access bit line BL and the non-access word line WL, and (ζ+Vthb)−Vss≤Cth between the non-access bit line BL and the access word line WL. A combination of these yields Vset≤2Cth−Vthb−Vthw. In addition, the condition for setting of the threshold voltage Cth includes such a margin that allows the memory cell MC in the weak reset state corresponding to '0' to satisfy Vset≥Cth+Vset/3. Therefore, Cth≤2Vset/3 leads to Vthb+Vthw≤Vset/3 and Vthb+Vthw≤Cth/2. If transistors in the driver for the bit line BL are the same as those in the driver for the word line WL, then Vthb=Vthw=Vth. Therefore, Vth≤Vset/6 and Vth≤Cth/4 provide stable operation with no variation in the threshold voltage Cth.

The influence of a fault cell causes a reverse bias at the maximum between the word line WL having a potential varied nearly to the set potential Vset and the bit line BL provided with a potential ζ=Vset/2. This is smaller than the lowermost potential when the memory cell MC in the set state changes to the weak reset state and accordingly it causes no problem. Naturally, the word line WL provided with the set potential Vset is given an increase in current via a diode-connected transistor.

Furthermore, the set phase at the active step is, regardless of write-intended data, executed over all access cells MC. This is for the following reason. In the case of an ion memory and so forth, once set in the set state, formation and resolution of a conductive filament can easily occur. Therefore, it is possible to expect a forming-like effect of the memory cell MC, for example, to make data write easier. It is also possible to expect an effect on aligning the states of memory cells MC in the reset state to uniform the conditions for reset setting at the time of beginning the subsequent reset phase.

The following description is given to the reset phase at the active step when reset setting is executed to the access cell MC.

Figure 24:
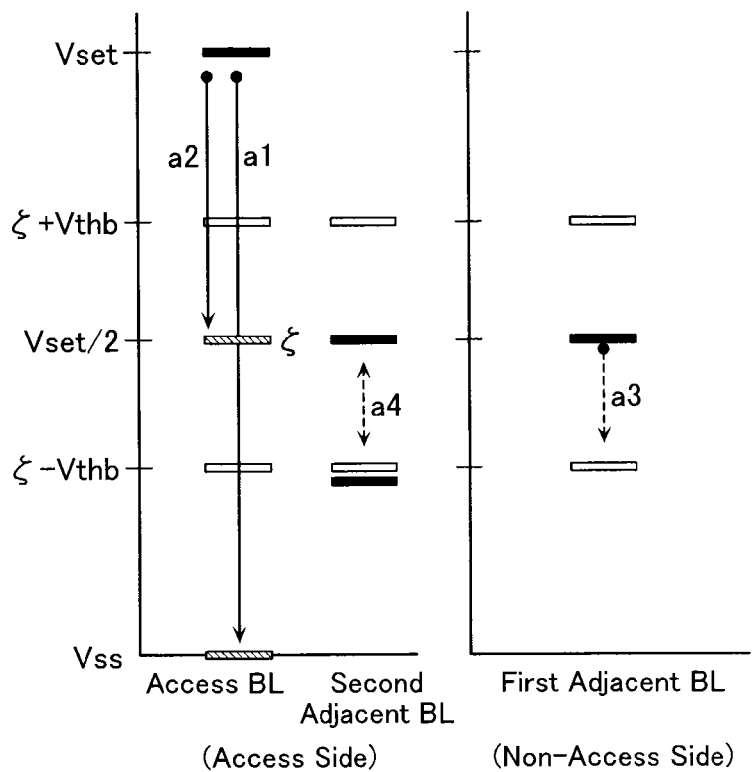
FIG. 24 is a diagram showing potential variations on bit lines in the reset phase at the active step in the pseudo-floating access method in the memory system according to the embodiment.
Figure 25:
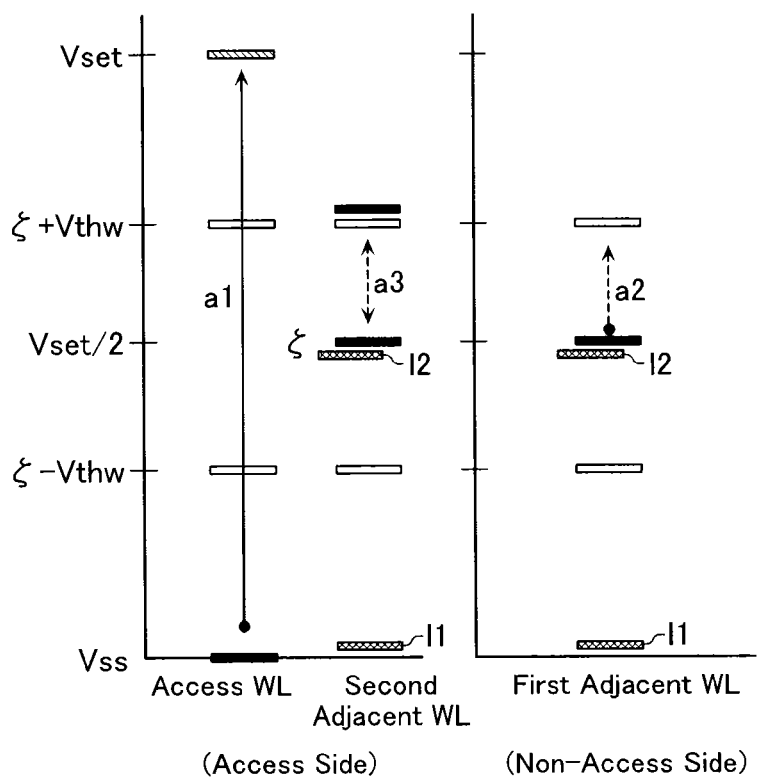
FIG. 25 is a diagram showing potential variations on word lines in the reset phase at the active step in the pseudo-floating access method in the memory system according to the embodiment.

FIGS. 24 and 25 are diagrams showing potential variations on selection lines in the reset phase at the active step in the pseudo-floating access method in the memory system according to the embodiment.

When the reset phase is executed following the set phase at the active step, the access bit line BL undergoes a potential variation from the set potential Vset and the access word line WL undergoes a potential variation from the ground potential Vss.

Once entering the reset phase, the access bit line BL connected to the memory cell MC targeted to reset setting is provided with the ground potential Vss, the access bit line BL having the set-setting-executed memory cell MC is provided with the potential Vset/2 for weak reset setting, and the access word line WL is provided with the set potential Vset. In addition, access-side non-access selection lines are in the floating state and non-access-side non-access selection lines are in the pseudo-floating state.

Selection lines are alternately driven from drivers on the facing sides of the MAT as described above. The first adjacent selection line is driven from the driver on the non-access side and therefore it turns to the pseudo-floating state. In addition, the second adjacent selection line is driven from the driver on the access side and therefore it turns to the floating state. Each selection line is surely shielded by selection lines on the facing side in a situation. Therefore, when the potential variations on the first and second adjacent selection lines at the time of access are seen, other non-access selection lines can be considered to cause no larger potential variations than the above. In addition, if a fault cell exists on the access bit line BL, the influence thereof also appears on the non-access word line WL connected to this fault cell. As a result, the non-access word line WL is pulled down to the ground potential Vss through the fault cell as shown by the thick line 11 in FIG. 25 or provided with the potential as shown by the thick line 12 in FIG. 25.

The access bit line BL is driven from the set potential Vset as shown in FIG. 24. In addition, the bit line BL connected to the memory cell MC targeted to reset setting is provided with the ground potential Vss as shown by the arrow a1 in FIG. 24. The bit line BL connected to the memory cell MC targeted to weak reset setting is provided with the potential Vset/2 as shown by the arrow a2 in FIG. 24. The access word line WL is driven from the ground potential Vss to the set potential Vset as shown by the arrow a1 in FIG. 25. As a result, due to the influence of nearly 100% capacitive coupling, the potential on the first adjacent selection line changes from the potential Vset/2 as shown by the arrow a3 in FIG. 24 and the arrow a2 in FIG. 25. As the first adjacent selection lines are in the pseudo-floating state, this potential variation can be suppressed to around the level of the potential $\zeta$–Vth on the first adjacent bit line BL and the level of the potential $\zeta$+Vth on the first adjacent word line WL.

In this case, all access-side non-access selection lines are brought into the floating state. Selection lines adjacent to these non-access selection lines are in the pseudo-floating state and function as shields. Accordingly, if access-side non-access selection lines are brought into the floating state, no problem occurs.

In access-side non-access selection lines, even if these non-access selection lines are in the floating state, any disturbances larger than the potential variation on the first adjacent selection line do not appear. Therefore, the potential variations on access-side non-access selection lines fall within ranges of the arrow a4 in FIG. 24 and the arrow a3 in FIG. 25.

A description is given to the amount of the maximum disturbance caused by the potential variation on the selection line as above and the condition for preventing failed operation.

The minimum potential caused on selection lines other than the access bit line BL is $\zeta$–Vthb as can be seen from FIG. 24. The maximum potential caused on selection lines other than the access word line WL is $\zeta$+Vthw as can be seen from FIG. 25. At this time, a disturbing reverse bias applied across the memory cell MC does not exceed the threshold voltage Cth already set in the memory cell MC in a condition, which is required for preventing the threshold voltage Cth of the memory cell MC from varying. In a word, this condition includes Vset–($\zeta$–Vthb)≤Cth between the access word line WL and the non-access bit line BL, and ($\zeta$+Vthw)–Vss≤Cth between the non-access word line WL and the access bit line BL. A combination of these yields Vset≤2Cth–Vthb–Vthw. In addition, the condition for setting of the threshold voltage Cth includes such a margin that allows the memory cell MC in the weak reset state corresponding to '0' to satisfy Vset≥Cth+Vset/3. Therefore, Cth≤2Vset/3 leads to Vthb+Vthw≤Vset/3 and Vthb+Vthw≤Cth/2. If transistors in the driver for the bit line BL are the same as those in the driver for the word line WL, then Vthb=Vthw=Vth. Therefore, Vth≤Vset/6 and Vth≤Cth/4 provide stable operation with no variation in the threshold voltage Cth.

This condition is the same as that for set setting described above.

In addition, the weak-reset-setting-executed memory cell MC is reverse-biased with a voltage Vset/2 and accordingly the threshold voltage Cth of this memory cell MC can be controlled to the voltage Vset/2 at the minimum.

Further, the influence of a fault cell causes a forward bias at the maximum between the word line WL having a potential varied nearly to the ground potential Vss and the bit line BL provided with a potential $\zeta$=Vset/2. This is smaller than the lowermost potential when the memory cell MC in the set state changes to the weak reset state and accordingly it causes no problem. Naturally, the word line WL provided with the ground potential Vss is given an increase in current via a diode-connected transistor.

The active final step is described next.

Figure 26:
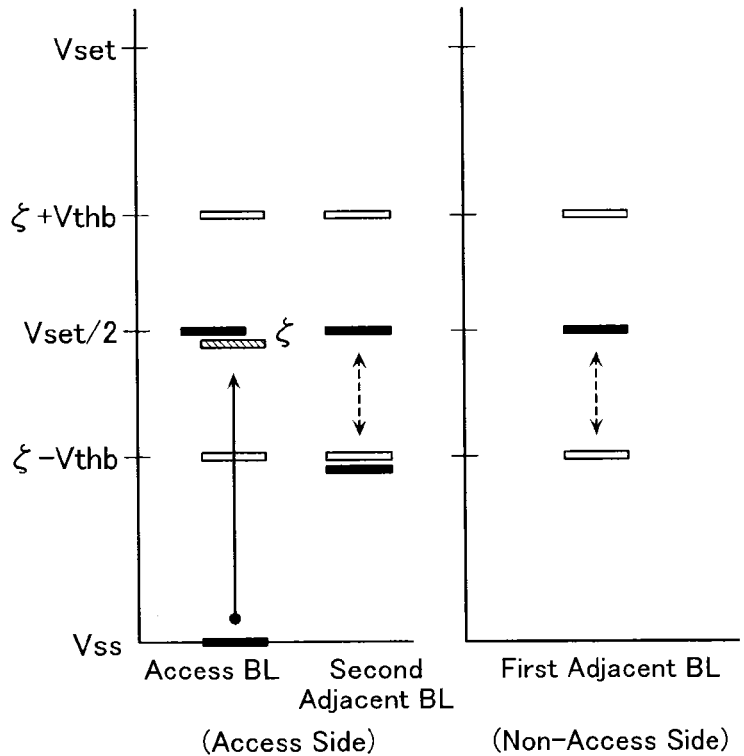
FIG. 26 is a diagram showing potential variations on bit lines at the active final step in the pseudo-floating access method in the memory system according to the embodiment.
Figure 27:
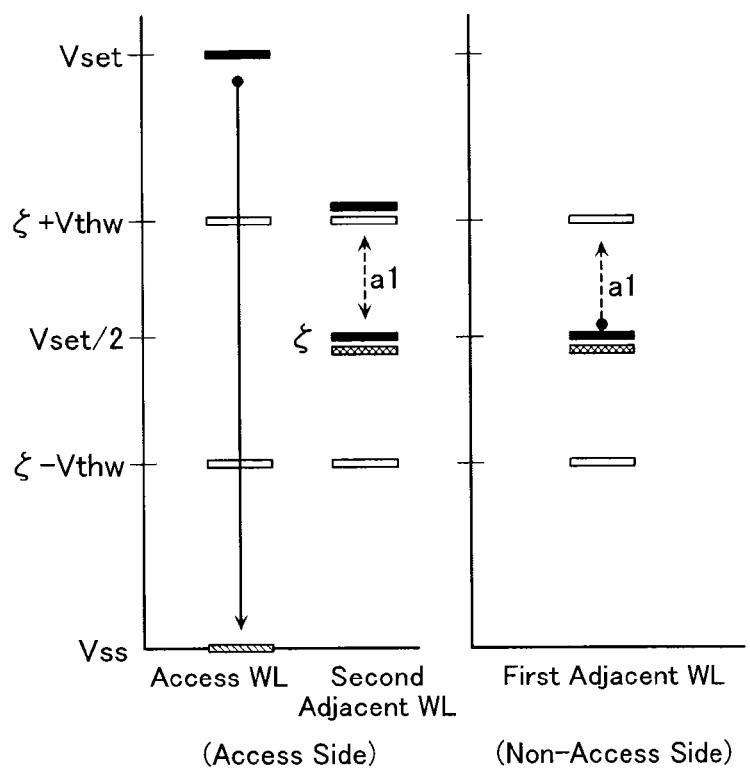
FIG. 27 is a diagram showing potential variations on word lines at the active final step in the pseudo-floating access method in the memory system according to the embodiment.

FIGS. 26 and 27 are diagrams showing potential variations on selection lines at the active final step in the pseudo-floating access method in the memory system according to the embodiment.

The active final step is a step of preventing the disturbance caused in the reset phase at the active step from elevating the threshold voltage Cth of the memory cell MC in the weak reset state. At the active final step, the access word line WL is provided with the ground potential Vss and the access bit line BL with the potential $\zeta$. Thus, non-access word lines WL distribute within a range of the potential Vset/2 (=$\zeta$ to the potential $\zeta$+Vth and bit lines BL distribute within a range of the potential $\zeta$ to the potential $\zeta$–Vth. Therefore, the memory cell MC on the access word line WL is forward-biased with a voltage $\zeta$ to a voltage $\zeta$–Vth. As a result, the filament gap in the memory cell MC becomes slightly narrower to suppress the increase in the threshold voltage Cth.

The influence of a fault cell acts such that the potential on the word line WL connected to the fault cell is set to $\zeta$ as shown by the arrow a1 in FIG. 27. Accordingly, it causes no problem.

The above description is given to the procedure of setting potentials on selection lines in the MAT. This setting can be realized by selection line drivers. These drivers are required to align at a high density around the MAT to increase the cell share of the three-dimensional MAT. Therefore, it is required to consider a simplified driver layout and a reduced space.

Then, the following description is given to a configuration example of a BL dry circuit block contained in the selection line driver. The BL dry circuit block herein described is configured for use in drivers for bit lines BL though it is also applicable to drivers for word lines WL. This is described later.

Figure 28:
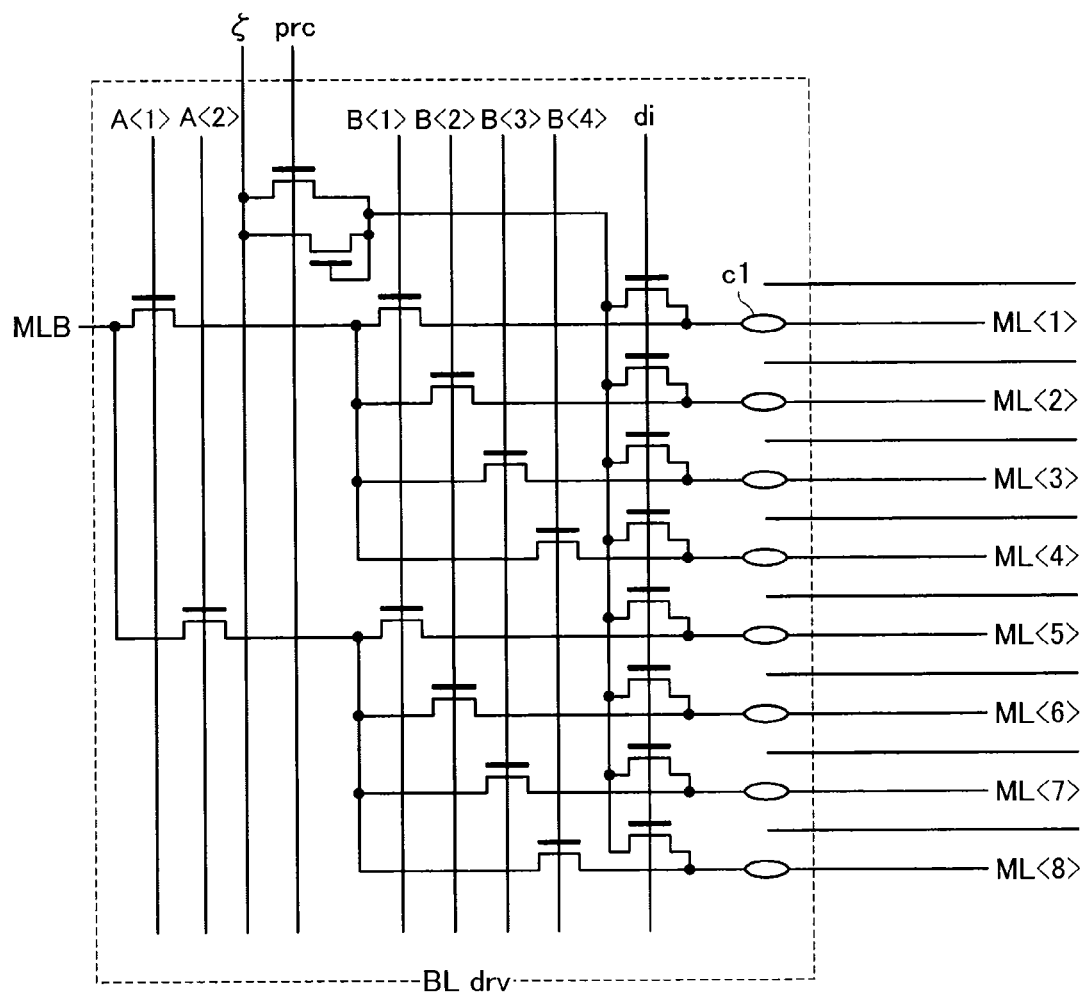
FIG. 28 is a circuit diagram of a BL dry circuit block in the memory system according to the embodiment.

FIG. 28 is a circuit diagram of the BL dry circuit block in the memory system according to the embodiment.

FIG. 28 is a circuit diagram in the case when BL dry circuit blocks are provided one by one on the access side and the non-access side at every 16 selection lines. In a word, the number of selection lines taken charge by one BL dry circuit block is equal to eight, and the remaining eight selection lines are taken charge by the facing-side BL dry circuit block. ML<1>-<8> shown in FIG. 28 indicate selection lines driven by one BL dry circuit block. In addition, an ellipse c1 in the figure indicates a portion connected to a vertical line for connecting each line in the three-dimensionally configured MAT to the BL dry circuit block. A "TILE" containing stacked MATs requires BL dry circuit blocks by the number of stacked MATs.

It is a signal di that decides whether selection lines ML<1>-<8> should be diode-connected to the power supply $\zeta$ or not. When the signal di is turned to 'H' and the signal prc is set to the potential $\zeta$, the potential on the selection line ML varies up/down from $\zeta$ by the threshold voltage Vth to configure a diode connection of a transistor that hardly allows current to flow in the selection line ML. At the standby step, the signal prc is turned to 'H' so that the selection line ML can be set to the potential ζ. At the active initial step, in the case of the driver for the bit line BL, the signal di supplied to two BL dry circuit blocks facing each other on the both sides of the MAT are turned to 'H' and the signal prc is set to the potential ζ to detect a fault based on the current flowing in the power supply ζ. When selection lines are brought into the pseudo-floating state, and when selection lines are set to the potential address signals A<1>-<2> and B<1>-<4> for selecting selection lines are all turned to 'L' to isolate selection lines ML from signal lines MLB.

When an access selection line is driven, initially, the signal di is turned to 'L' to isolate selection lines from the power supply ζ. Subsequently, a combination of the signals A<1>-<2> and B<1>-<4> is used to select which selection line ML of selection lines ML<1>-<8> is determined as an access selection line. The access selection line is connected to a signal line MLB. When the signals A<1>-<2> and B<1>-<4> are supplied to all BL dry circuit blocks in common, selection lines can be selected simultaneously one from every BL dry circuit block. In contrast, when the signals A<1>-<2> and B<1>-<4> are supplied to every group of BL dry circuit blocks separately, the number of simultaneously selectable selection lines can be adjusted.

The signal MLB is a signal for driving the bit line BL and monitoring the state of the memory cell MC. It is supplied to a sense amp and an access circuit.

The signal line MLB is provided with the set potential Vset, the ground potential Vss and the potential ζ in accordance with data to be written in the memory cell MC. The simultaneously selected bit lines BL are provided with the potentials Vset, Vss and ζ individually and simultaneously. This potential setting is executed in an access circuit, a register and so forth contained in a data bus provided at the front of the driver.

The word lines WL of selection lines are selected only one per MAT. Therefore, when the driver for the word line WL on the access side selects one BL dry circuit block to supply the signal MLB, the above-described BL dry circuit block can also be applied to the driver for the word line WL.

Figure 29:
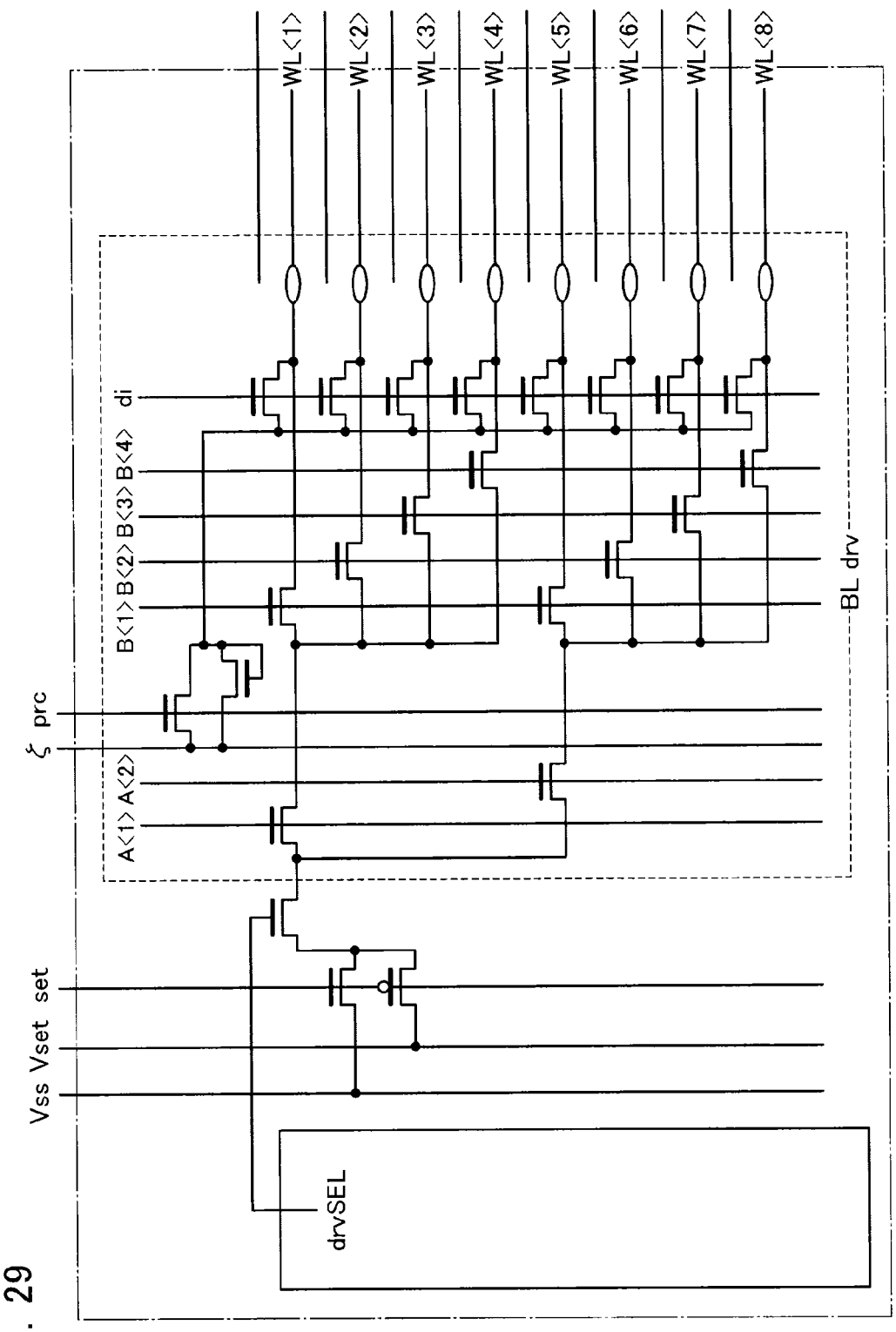
FIG. 29 is a circuit diagram of a word line driver in the memory system according to the embodiment.

FIG. 29 is a circuit diagram of a word line driver in the memory system according to the embodiment. A circuit surrounded by a chain line in the figure shows the driver for the word line WL.

The circuit shown in FIG. 29 includes the BL dry circuit block shown in FIG. 28 and additionally a drvSEL circuit block operative to select one BL dry circuit block.

The outputs of the BL dry circuit block lead to word lines WL<1>-<8>. This BL dry circuit block provides the access word line WL with the ground potential Vss when the access-targeted MAT is at the active initial step or in the set phase at the active step and with the set potential Vset when it is in the reset phase at the active step. This switching is executed by a signal, set. This signal, set, is used to control an Nch transistor and a Pch transistor to supply the ground potential Vss or the set potential Vset to the BL dry circuit block from the drvSEL circuit block via a switch transistor. The switch transistor is on/off controlled in accordance with a signal drvSEL provided from the drvSEL circuit block.

The following description is given to the drvSEL circuit block, that is, a circuit operative to select one word line WL from the MAT.

Figure 30:
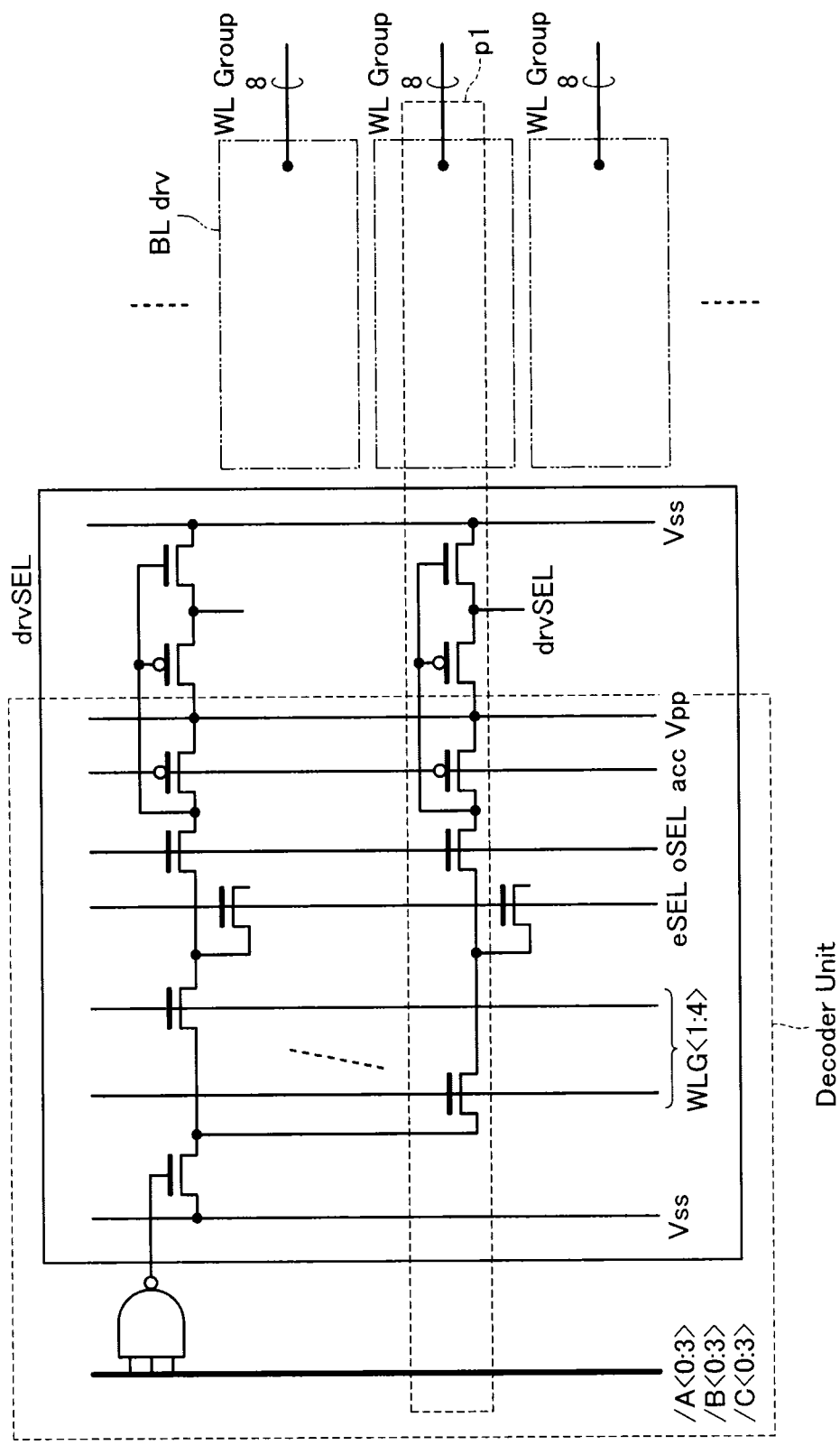
FIG. 30 is a circuit diagram of a drvSEL circuit block in the memory system according to the embodiment.

FIG. 30 is a circuit diagram of the drvSEL circuit block in the memory system according to the embodiment.

The output from this drvSEL circuit block is the signal drvSEL as described above. This signal drvSEL turns to 'L' so as not to select the BL dry circuit block. It brings the input of the BL dry circuit block into the floating state. The drvSEL circuit block, the signal drvSEL, receives a signal indicative of the decoding state, on gates of a Pch transistor and an Nch transistor, and connects the signal drvSEL to the ground potential Vss or to the power supply of a potential Vpp higher than the set potential Vset.

As shown by the dashed-line square in FIG. 30, part of the drvSEL circuit block and a NAND circuit configure a decoder unit. The decoder unit receives a signal, acc, for precharging to the supply potential Vpp, signals eSEL, oSEL and WLG<1:4> for discharging the supply potential Vpp, and the output from the NAND circuit operative to decode address signals /A<0:3>, /B<0:3> and /C<0:3>. Namely, this decoder unit uses the signals eSEL, oSEL and WLG<1:4> to select one of eight BL dry circuit blocks. It also decodes the signals /A<0:3>, /B<0:3> and /C<0:3> to select one drvSEL circuit block. Therefore, in the case of the example shown in FIG. 30, one side of the MAT is configured by $8 \times 4^3 = 512$ word line groups of eight word lines WL. At the access-side driver operative to select an access word line WL, the signal acc turns to 'H' to stop precharging to the decoder unit. The decoder unit includes a serial circuit p1 of plural transistors each controlled by the signal eSEL or oSEL, one of the signals WLG<1:4>, or the output from the NAND circuit. Via this serial circuit p1, the charge on a precharge node is discharged to the ground potential Vss.

At the active initial step, the decoder unit sets the selected word line WL on the ground potential Vss. At this time, if certain or more current flows continuously in the power supply of the potential ζ, the word line WL is decided to have a short fault and it is controlled not to make access to this word line WL thereafter. The address signals /A<0:3>, /B<0:3> and /C<0:3> are generated on the basis of the access-forbidden address of this word line WL.

The following description is given to an example of the layout of the BL dry circuit block.

Figure 31:
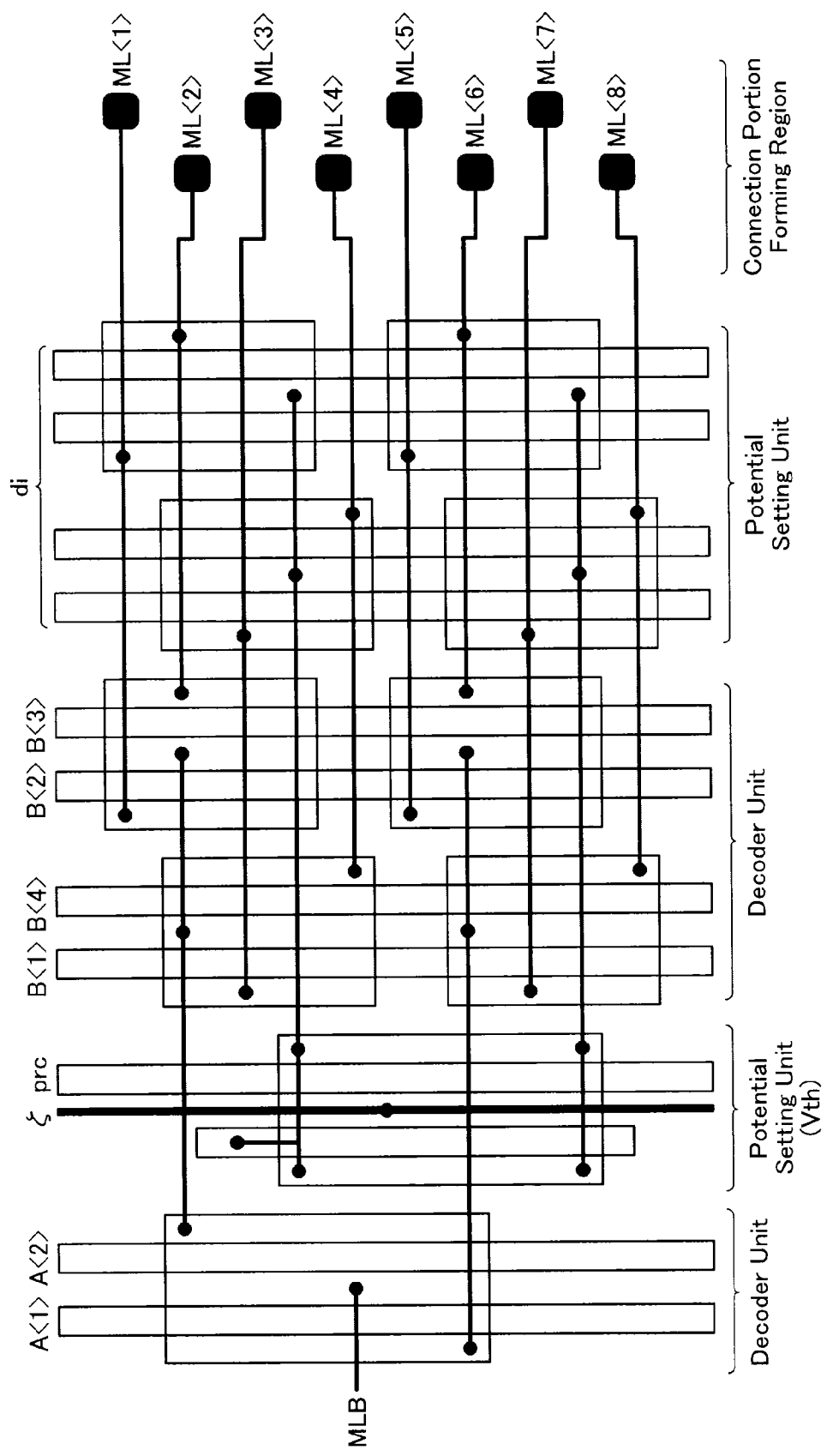
FIG. 31 is a diagram showing a layout of the BL dry circuit block in the memory system according to the embodiment.

FIG. 31 is a diagram showing a layout of the BL dry circuit block in the memory system according to the embodiment.

One of the purposes for simplifying the periphery of the selection line drivers is, as described above, to reduce the area occupied by the peripheral circuit in the entire MAT. The selection lines in the MAT are formed with the minimum line width and arranged at the minimum intervals. Therefore, the gate length of the transistor in the peripheral circuit becomes the same as the width of the arrangement region of plural selection lines. As a result, if the extending direction of the transistor gate in the peripheral circuit is laid out along the extending direction of the selection line, the layout of the transistor may superimpose thereon to prevent the arrangement as can be predicted. Therefore, the BL dry circuit block is laid out such that the extending direction of the transistor gate orthogonally intersects the extending direction of the selection line. FIG. 31 shows an example thereof. Furthermore, the transistor gate line extending in the vertical direction in FIG. 31 may also be made thicker than that shown in FIG. 31. In addition, in the case of the layout in FIG. 31, the gage can be formed along the circumference of the MAT without gaps such as selection lines.

In the case of the layout of the BL dry circuit block shown in FIG. 31, a connection portion forming region, a potential setting unit, a decoder unit, a potential setting unit and a decoder unit are arranged in this order from right to left in FIG. 31.

The connection portion forming region located rightmost in FIG. 31 is a region for forming connection portions associated with vertical lines extending from the MAT. Eight connection portions corresponding to the selection lines ML<1>-<8> are arranged four by four in two rows in the case of FIG. 31.

Neighbor to the left side of the connection portion forming region, a potential setting unit is arranged. This potential setting unit is a unit operative to set the potential of the signal di for on/off controlling the diode-connected transistors used in the drivers on the access side and the non-access side. Four gate lines supplied with flows of the same signal di are arranged in a direction orthogonal to the extending direction of selection lines to make a layout possible.

Neighbor to the left side of the potential setting unit of the signal di, a decoder unit is arranged. This decoder unit includes an arrangement of gate lines supplied with flows of signals B<1>-<4> for selecting two of eight selection lines. In addition, neighbor to the left side of this decoder unit, a potential setting unit is arranged. This potential setting unit includes an arrangement of a supply line of the potential ζ and a gate line supplied with a flow of the signal prc for initial potential setting. Further, neighbor to the left side of this potential setting unit, a decoder unit is arranged. This decoder unit includes an arrangement of gate lines supplied with flows of signals A<1>-<2>. This is a unit operative to decode the input MLB.

This BL dry circuit block includes an arrangement of 10 lines along the extending direction of selection lines. In contrast, BL dry circuit blocks are arranged one by one on the both sides of the MAT. A total number of selection lines driven by these two BL dry circuit blocks is equal to 16. In a word, in the vertical direction in FIG. 31, it is sufficient to arrange only 10 lines within the region having an arrangement of 16 selection lines. Therefore, even considering connections of these lines with transistors, an implementation by the layout shown in FIG. 31 is possible.

The following description is given to a current monitor, that is, a functional block operative to detect a fault word line WL present in a MAT in the TILE.

Figure 32:
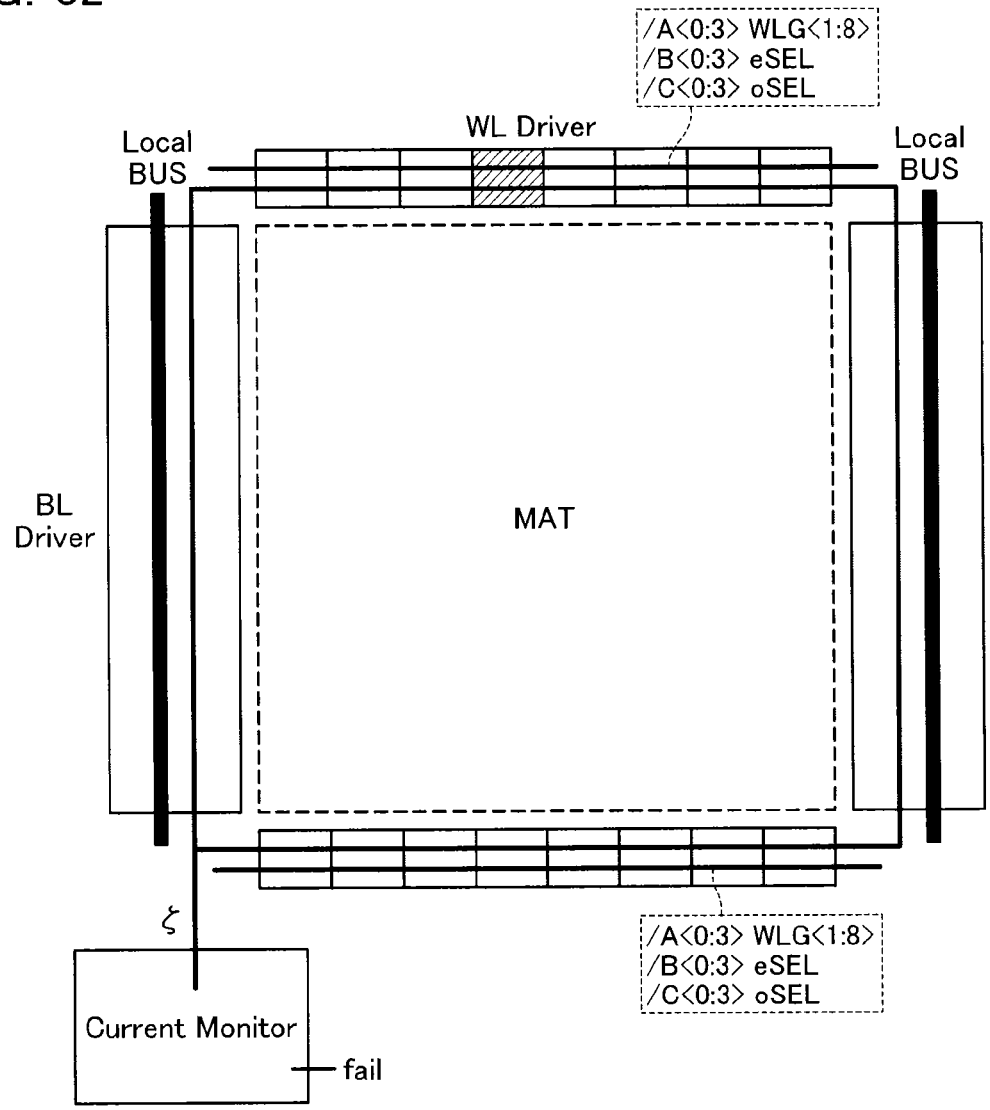
FIG. 32 is a diagram showing a peripheral circuit configuration around a TILE in the memory system according to the embodiment.

FIG. 32 is a diagram showing a peripheral circuit configuration around the TILE in the memory system according to the embodiment.

As described above, at the active initial step, current in the power supply ζ is monitored. This monitor-targeted current is a current supplied from the power supply ζ at every access-targeted MAT. If the current in a word line WL driven by a driver hatched in FIG. 32 increases from the initial stage and thereafter does not lower to a certain level, the current monitor decides that the word line WL has a fault. Then, the current monitor provides a signal, fail, indicative of the presence of a fault in the word line WL to other functional blocks.

Another fault factor than the short fault is a fault in the retention property of a memory cell MC.

A memory cell MC varies the cell state voluntarily. Accordingly, depending on the cell state, retention for a sufficiently long time cannot be expected. Then, the following description is given to a method of extending apparent retention in the memory system.

Figure 33:
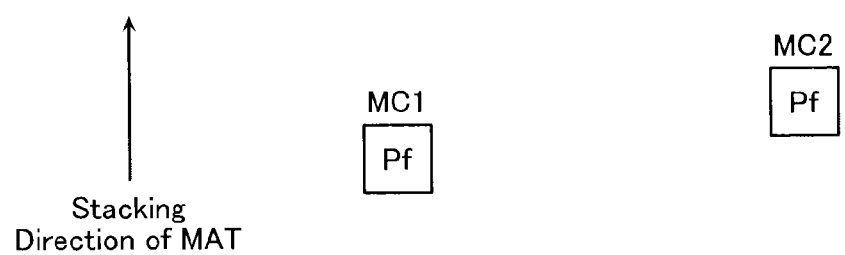
FIG. 33 is a diagram illustrative of a method of improving the retention property of the memory system according to the embodiment.

FIG. 33 is a diagram illustrative of a method of improving the retention property of the memory system according to the embodiment.

The retention fault probability per unit time is denoted with Pf. This fault probability Pf correlates to the variation in the threshold voltage Cth of the memory cell MC. As the threshold voltage Cth of the memory cell MC increases in accordance with the natural transition, the fault probability Pf also increases accordingly. The increase in the threshold voltage Cth of the memory cell MC corresponds to the resolution of the conductive filament in the case of an ion memory.

A memory cell having no fault (hereinafter, also referred to as a "normal cell") is turned to a fault cell in the next unit time at a certain proportion. In this case, when T denotes the time required for normal cells to turn at a certain proportion to fault cells, the proportion of retention faults can be represented by $1-e^{(-t/T)}$ where t denotes time. Therefore, the fault rate at the time t+dt becomes $(1/T)e^{(-t/T)}dt$ and the proportion of normal cells at the time t becomes $e^{(-t/T)}$. Therefore, the fault probability of the memory cell MC becomes Pf=1/T. Fault probabilities Pf of individual memory cells MC are independent. Therefore, two memory cells MC, for example, simultaneously become faulty at a probability of $Pf^2$, which is smaller than a fault probability Pf of one memory cell MC.

When information data is stored using two memory cells MC1 and MC2 (cell group), it is important for these two memory cells MC1 and MC2 to behave independently. Therefore, as the memory cells MC1 and MC2, in consideration of the positional relation in the stacking direction of MATs and the positional relation in a MAT, a combination of two memory cells MC1 and MC2 having as small a physical correlation as possible is selected. Note that a combination should be considered so as not to complicate access to these memory cells MC1 and MC2. Hereinafter, the combination of such two memory cells MC may also be referred to as a "parallel cell". The parallel cell is conceptually named to the last. For reducing the physical correlation between memory cells MC1 and MC2, two memory cells MC1 and MC2 in different MATs may be combined. Desirably, the memory cells MC1 and MC2 contained in the parallel cell are connected individually to separate bit lines BL. This is for the following reason. If the memory cells MC1 and MC2 in the parallel cell are considered to store information data separately, access to the parallel cell is the same as parallel access to two memory cells MC1 and MC2, and accordingly the conventional sense system and data processing logic can be used.

The following description is given to a method of configuring a parallel cell from a combination of two memory cells MC1 and MC2 in the same MAT.

FIG. 34 is a diagram illustrative of an example of a method of configuring a parallel cell in the memory system according to the embodiment.

The parallel cell includes a combination of two memory cells MC1 and MC2, which are connected to a common word line WL and connected to different bit lines BL1 and BL2. Hereinafter, the parallel cell thus configured is referred to as a "three-terminal cell". The three-terminal cell has four combinations of cell states of memory cells MC1 and MC2, which are simply expressed as "cell states of a three-terminal cell".

In one MAT, two memory cells MC1 and MC2 having as small physical characteristics or temporal and spatial correlations as possible can be combined to configure a three-terminal cell. In this regard, it is sufficient for any three-terminal cell to configure the three-terminal cell so as to uniform the distance in a MAT between a bit line BL1 connected to the memory cell MC1 and a bit line BL2 connected to the memory cell MC2. In a word, as shown in FIG. 34, it is sufficient to select two memory cells MC1 and MC2 separating from each other by the distance roughly equal to half the width in the extending direction of the word line WL in the MAT. When three-terminal cells are configured in the same MAT, spatial variations arise in every three-terminal cell in other methods. Therefore, variations may possibly arise also in physical characteristics. If physical characteristics cannot be determined in accordance with only the spatial correlation, other configuring methods may be applied.

The following description is given to read/write of information data from/to a three-terminal cell. As the precondition, in the case of storing information data in one memory cell MC, the procedure of reading/writing information data from/to plural memory cells MC in parallel is described.

Figures 37, 38, 39, 40:
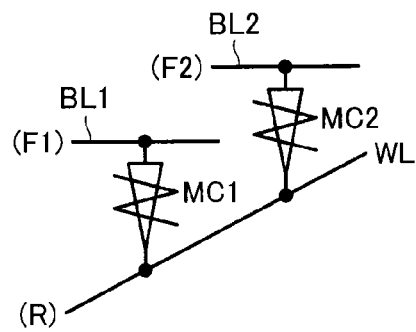
FIG. 37 is a diagram illustrative of selection line potential setting at the time of parallel write operation to plural memory cells in the memory system according to the embodiment.
FIG. 38 is a diagram illustrative of selection line potential setting at the time of parallel read operation to plural memory cells in the memory system according to the embodiment.
FIG. 39 is a diagram illustrative of selection line potential setting at the time of write/read operation to a three-terminal cell in the memory system according to the embodiment.
FIG. 40 is a diagram illustrative of selection line potential setting at the time of write operation to a three-terminal cell in the memory system according to the embodiment.

FIGS. 35-37 are diagrams illustrative of selection line potential setting at the time of parallel write operation to plural memory cells in the memory system according to the embodiment. In FIGS. 36 and 37, 'F' denotes the potential set on a selection line connected to the anode side of a memory cell MC, for example, a bit line BL as shown in FIG. 35. In FIGS. 36 and 37, 'R' denotes the potential set on a selection line connected to the cathode side of a memory cell MC, for example, a word line WL as shown in FIG. 35. In this case, if the potential F is made higher than the potential R, the memory cell MC is forward-biased. If the potential R is made higher than the potential F, the memory cell MC is reverse-biased.

In the case of a memory cell MC subjected to '0' write, the bit line BL connected to this memory cell MC is provided with the potential F=Vset. In the case of a memory cell MC subjected to '1' write, the bit line BL connected to this memory cell MC is provided with the potential F=Vss. In this connection, '0' corresponds to the set state (low resistance state) and '1' corresponds to the reset state (high resistance state). The potential variation on the word line WL at the time of write operation is constant and R varies three times except the initial value and the final value. Hereinafter, R varies n times except the initial value and the final value in a cycle, which may also be referred to as an "n-state cycle". Namely, R varies, after it is set to the ground potential Vss, to the set potential Vset and varies again to the ground potential Vss. When data is written in plural memory cells MC on the same word line WL in parallel, it is not possible to provide plural bit lines BL connected to these memory cells MC with the set potential Vset and the ground potential Vss as F simultaneously. This is for the following reason. If a fault cell exists, the set potential Vset and the ground potential Vss may possibly be set on unintended selection lines connected to non-access cells MC via the fault cell. Then, even if a fault cell exists, it is desired to suppress the voltage applied to a memory cell MC to Vset/2 so as to prevent the cell state of the memory cell MC from varying. Then, when data is written in plural memory cells MC in parallel, at the time of '1' write, the potential F=Vset/2 is set on the memory cell MC subjected to '0' write. In addition, even in any data write, a memory cell MC is initially subjected to set setting. This aims at the forming effect of the memory cell MC, and aims at the effect of relieving the voltage condition for changing the memory cell MC in the reset state to the set state. In addition, at the time of reset setting, a transition is made always from the set state. Therefore, regardless of the history of the memory cell MC, the conditions for reset setting can be arranged. Further, in '0' write, the potential F=Vset/2 is applied so that the memory cell MC is subjected to weak reset setting. At the end of data write, the memory cell MC is provided with the potential R=Vss and the potential F=Vset/2 to apply a forward bias. This makes it possible to suppress the rise in the threshold voltage Cth of the memory cell MC in the weak reset state. In consideration of only '1' write, that is, reset setting, there is no meaning of write operation executed in a three-state cycle. The three-state cycle is, though, applied to execute write operation in parallel with a '0'-write-targeted memory cell MC that shares the word line WL. With respect to any data, the potential Vset/2 is set as the initial values and the final values of the potential F and the potential R. This setting makes it possible to execute parallel write operation of '1' and '0' in this order to plural memory cells MC that share the word line WL.

FIG. 38 is a diagram illustrative of selection line potential setting at the time of parallel read operation to plural memory cells in the memory system according to the embodiment. 'F' and 'R' shown in FIG. 38 correspond to 'F' and 'R' shown in FIG. 35, respectively.

When data is read from a memory cell MC, the memory cell MC is provided with the potential F=Vread and the potential R=Vss. Then, current flowing in the bit line BL is monitored to decide that the data stored in the memory cell MC is '0' if the current is large and '1' if the current is small. The potential set on the word line WL at the time of read operation is only the read potential Vread, which provides a one-state cycle.

The following description is given to writing information data to a three-terminal cell.

FIGS. 39-43 are diagrams illustrative of selection line potential setting at the time of write operation to a three-terminal cell in the memory system according to the embodiment. A three-terminal cell has three terminals, as shown in FIG. 39, including the anode of the memory cell MC1 connected to the bit line BL1, the anode of the memory cell MC2 connected to the bit line BL2, and the cathode of the memory cells MC1 and MC2 commonly connected to the word line WL. The three-terminal cell has four cell states. Processes for writing these four cell states are referred to as a '00' process, a '10' process, a '01' process, and a '11' process, respectively. FIG. 40 shows the '00' process, FIG. 41 the '10' process, FIG. 42 the '01' process, and FIG. 43 the '11' process. As shown in FIG. 39, 'F1' and 'F2' in FIGS. 40-43 denote the potentials set on the selection lines connected to the anode sides of the memory cells MC1 and MC2, for example, the bit lines BL1 and BL2. In addition, as shown in FIG. 39, 'R' in FIGS. 40-43 denotes the potential set on the selection line connected to the cathode side of the memory cells MC1 and MC2, for example, the word line WL.

Write to the three-terminal cell can be realized by a combination of potential setting for '0' write and potential setting for '1' write described using FIGS. 35-37. For example, in the case of the '00' process, potential setting of the potentials R and F1 and that of the potentials R and F2 are both used as potential setting for '0' write shown in FIG. 36. In addition, in the case of the '01' process, potential setting of the potentials R and F1 is used as potential setting for '0' write shown in FIG. 36, and potential setting of the potentials R and F2 is used as potential setting for '1' write shown in FIG. 37. The same goes for the '10' process and the '11' process. Therefore, in all processes, word lines WL stay in three-state cycles. Further, a three-terminal cell has four cell states. Accordingly, it turns to a four-state cell naturally.

The four states of the three-terminal cell are described next.

Figures 44, 45:
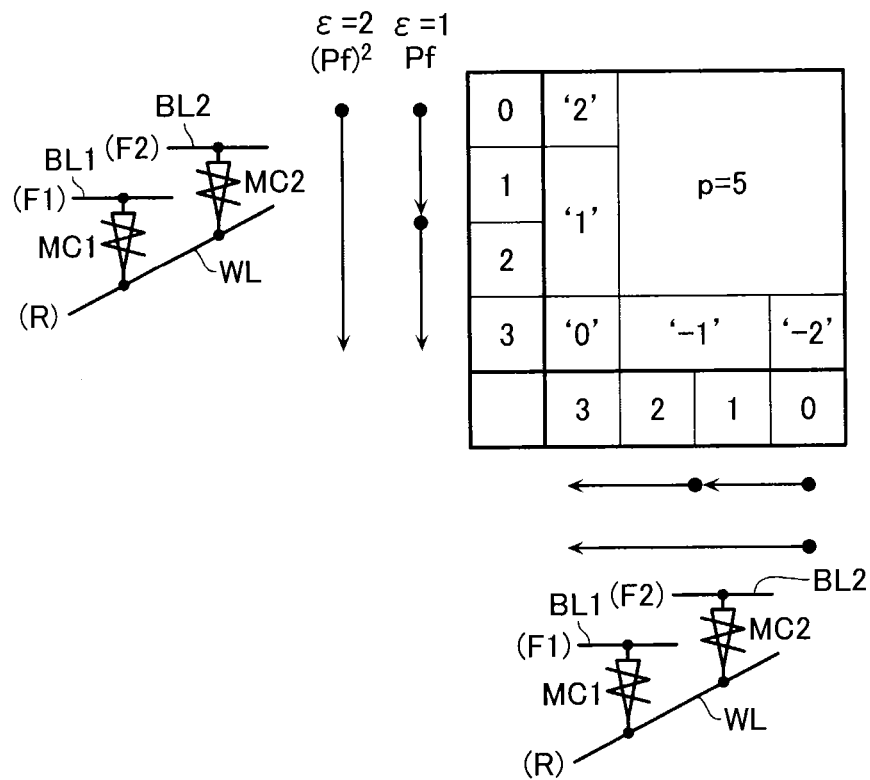
FIG. 44 is a diagram showing correspondences between write processes to a three-terminal cell and the corresponding values in the memory system according to the embodiment.
FIG. 45 is a diagram showing an assignment of logical states of $Z_5$ to cell states of a pair three-terminal cell in the memory system according to the embodiment.

FIG. 44 is a diagram showing correspondences between write processes for a three-terminal cell and the corresponding values in the memory system according to the embodiment.

The four cell states of the three-terminal cell are provided with values for distinction. A combination of the reset state and the reset state set in the process '11' ("r-r" shown in FIG. 44) is provided with a value 3, a combination of the set state and the reset state set in the process '01' ("s-r" shown in FIG. 44) with a value 2, a combination of the reset state and the set state set in the process '10' ("r-s" shown in FIG. 44) with a value 1, and a combination of the set state and the set state set in the process '00' ("s-s" shown in FIG. 44) with a value 0. In the case of an ion memory, a natural transition arises from the set state toward the reset state. Therefore, the value 0 changes to the value 1 or 2, and the value or 2 changes to the value 3 while the value 3 stays in a stable state.

When such the cell states of the three-terminal cell are associated with the values of information data, it is made possible to improve retention of data and efficiently develop an error correction code (ECC).

For example, a four-value storable three-terminal cell is utilized as a binary cell to make information data '0' correspond to the cell state 0, 1 or 2 and information data '1' to the cell state 3. At the time of write operation, '0' write is processed in the '00' process and '1' write in the '11' process. As long as two memory cells MC1 and MC2 both cause no retention fault, the three-terminal cell causes no retention fault as a whole. Therefore, the fault probability Pf is squared to improve the retention property. In addition, information data can contain an ECC corresponding to normal binary data to further improve the retention property.

A three-terminal cell can be utilized as a four-value cell so that information data is coded and stored in the three-terminal cell to improve the reliability more efficiently. Then, the following description is given to the instance when information data is coded to a Lee Metric Code (LMC), which is then stored in three-terminal cells.

The LMC utilizes the expressions of a reduced residue class Zp and accordingly requires assignments of the logical states of Zp to the cell states of the memory cell MC. At that time, for efficiently configuring the ECC, it is important to assign the variations between adjacent expressions of Zp to the variations in the cell state of the memory cell MC correspondingly.

The configuration of an ECC of the LMC requires a prime p to be made equal to 5 or more. The instances associated with primes p of 5 and 7 are herein handled. If a prime p is made equal to 5 or 7, only a single three-terminal cell, that is, a four-value cell is not enough for the number of cell states. Then, even though the utilization efficiency of memory cells MC worsens, a pair of three-terminal cells is utilized to assign 16 combinations of cell states of two three-terminal cells to the logical states of Zp. Hereinafter, the pair of three-terminal cells may also be referred to as a "pair three-terminal cell". Further, as for the pair three-terminal cell, combinations of cell states of two three-terminal cells are simply expressed as "cell states of a pair three-terminal cell".

Figure 46:
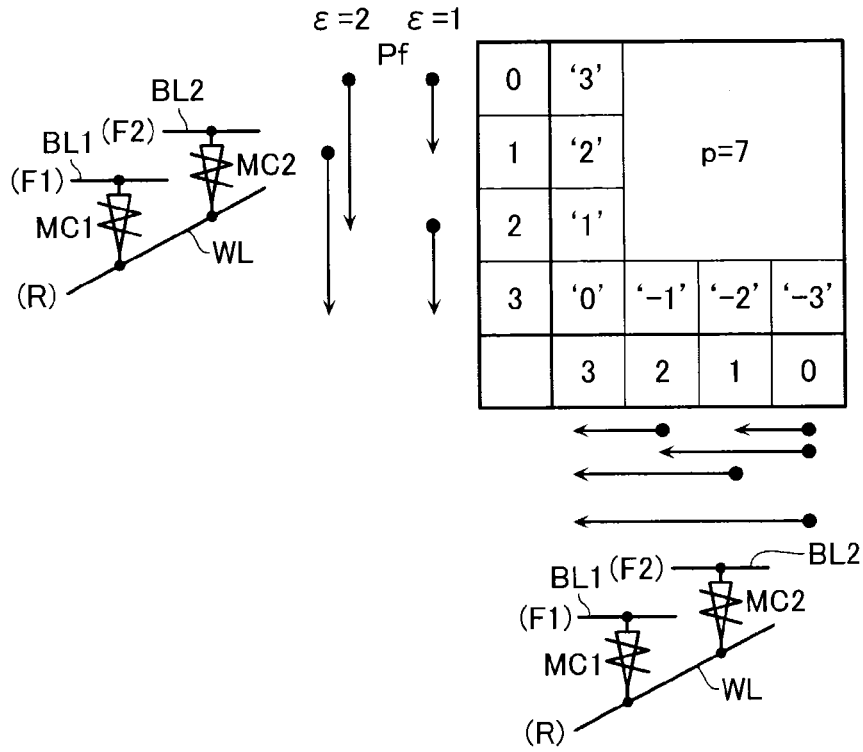
FIG. 46 is a diagram showing an assignment of logical states of $Z_7$ to cell states of a pair three-terminal cell in the memory system according to the embodiment.

FIGS. 45 and 46 are diagrams showing assignments of logical states of Zp to cell states of a pair three-terminal cell in the memory system according to the embodiment. FIG. 45 is in the case of p=5 and FIG. 46 is in the case of p=7. FIGS. 45 and 46 show one three-terminal cell of the pair three-terminal cell along the lateral axis and the other three-terminal cell along the vertical axis. In addition, the most unstable cell state 0 of the cell states of the three-terminal cell is located farthest from the origin and the most stable cell state 3 is located nearest to the origin in a matrix expression.

In the cases of FIGS. 45 and 46, assignments are executed in such a manner that the variations in the logical states of Zp correspond to the variations in the cell state of the pair three-terminal cell as many as possible. Therefore, nine cell states of 16 cell states are not utilized.

In the case of p=5, five logical states of $Z_5$, that is, −2' to '2' are assigned as shown in FIG. 45. The cell states 1 and 2 of the three-terminal cell are utilized without distinction and one of the pair three-terminal cell is surely utilized in the stable cell state 3. The retention fault probability due to the natural transition of the memory cell MC is denoted with Pf. The use of an ECC capable of error correction of E=1 (E means a leap of the logical state of Zp) makes it possible to correct a variation in the logical state of $Z_5$ caused by a transition from 0 to 1 or 2 or a transition from 1 or 2 to 3 in the cell state of the three-terminal cell. Therefore, the retention fault property can be improved nearly to $(Pf)^2$. The use of an ECC capable of error correction of $\epsilon$=2 makes it possible to correct a variation in the logical state of $Z_5$ caused by a transition from 0 to 3 in the cell state of one three-terminal cell, and a transition from 0 to 1 or 2 or a transition from 1 or 2 to 3 simultaneously caused in the cell states of two three-terminal cells. Therefore, the retention fault property can be improved nearly to $(Pf)^3$.

In the case of p=7, seven logical states of $Z_7$, that is, −3' to '3' are assigned as shown in FIG. 46. The cell states 1 and 2 of the three-terminal cell are utilized distinctively and one of the pair three-terminal cell is surely utilized in the stable cell state 3. The cell states 1 and 2 of the three-terminal cell have an exclusive relation therebetween and accordingly these cell states cause no transition therebetween. The retention fault probability due to the natural transition of the memory cell MC is denoted with Pf. The use of an ECC capable of error correction of $\epsilon$=1 makes it possible to correct a variation in the logical state of $Z_7$ caused by a transition from 0 to 1 or a transition from 2 to 3 in the cell state of the three-terminal cell. Therefore, the retention fault property can be improved nearly to $(Pf)^2$. The use of an ECC capable of error correction of $\epsilon$=2 makes it possible to correct a variation in the logical state of $Z_7$ caused by a transition from 0 to or a transition from 1 to 3 in the cell state of the three-terminal cell, and a transition from 0 to and a transition from 2 to 3 simultaneously caused in the cell states of two three-terminal cells. Therefore, the retention fault property can be improved nearly to $(Pf)^2$. A transition from 0 to 3 in the cell state of the three-terminal cell cannot be corrected because of $\epsilon$=3. Note that an ECC capable of error correction of $\epsilon$=3 has a configuration remarkably made complex more than the ECC capable of error correction of $\epsilon$=2.

Thus, in the case of p=5, the use of the ECC capable of error correction of $\epsilon$=2 improves the retention fault property nearly to $(Pf)^3$ while the utilization efficiency of the memory cell MC worsens. One code is stored using four pair three-terminal cells, that is, 16 memory cells MC and information data is stored using one pair three-terminal cell. Therefore, 16 memory cells MC can be used to store not more than 2.3 ($\approx 1 \times \log_2 5$) bits of information data. On the other hand, the use of the ECC capable of error correction of $\epsilon$=1 improves the retention fault property nearly to $(Pf)^2$. As for the utilization efficiency of the memory cell MC, one code is stored using four pair three-terminal cells and information data is stored using two pair three-terminal cells. Therefore, 16 memory cells MC can be used to store 4.6 ($\approx 2 \times \log_2 5$) bits of information data.

In the case of p=7, the retention fault property can be improved nearly to $(Pf)^2$. In addition, one code is stored using six pair three-terminal cells and information data is stored using three pair three-terminal cells. Therefore, 24 memory cells MC can be used to store 8.4 ($\approx 3 \log_2 7$) bits of information data.

The following description is given to the instance when a LMC of p=2 is stored in three-terminal cells.

Figure 47:
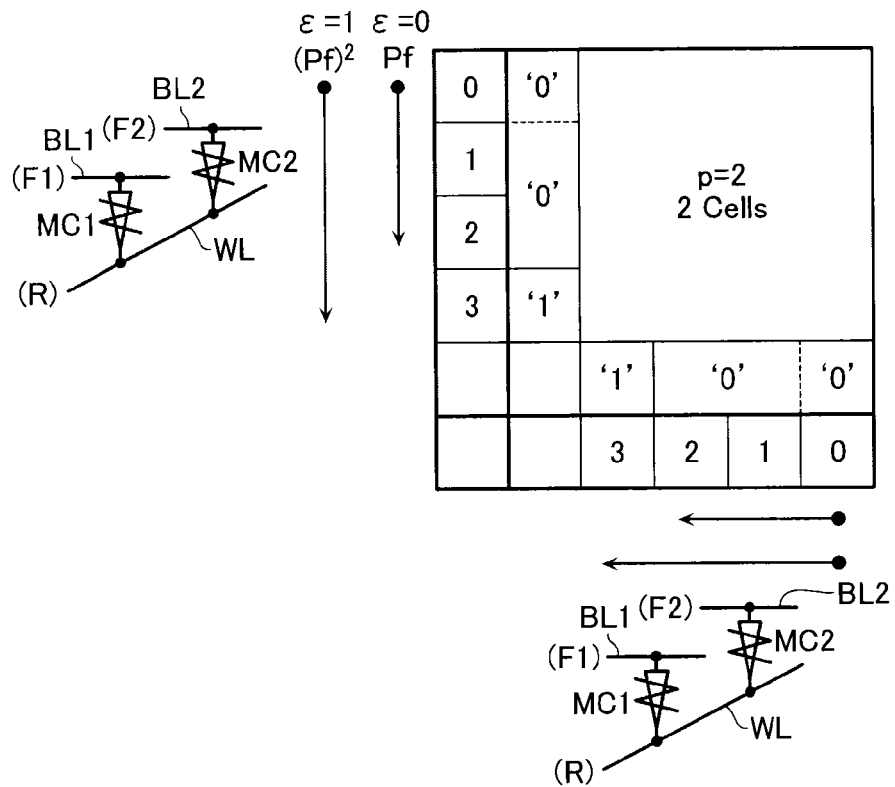
FIG. 47 is a diagram showing an assignment of logical states of $Z_2$ to cell states of two three-terminal cells in the memory system according to the embodiment.

FIG. 47 is a diagram showing an assignment of logical states of $Z_2$ to cell states of two three-terminal cells in the memory system according to the embodiment.

The LMC of p=2 is equal to a binary code. In this case, three-terminal cells are not utilized in a pair. Accordingly, two three-terminal cells shown along the lateral axis and the vertical axis in a matrix of FIG. 47 have a mutually independent relation therebetween.

In the case of p=2, two logical states of $Z_2$, that is, '0' and '1' are assigned as shown in FIG. 47. The cell states of 0, 1 and 2 of the three-terminal cell are utilized without distinction, and a logical state of $Z_2$, '0', is determined to correspond to the cell state 0 of the three-terminal cell. The retention fault probability due to the natural transition of the memory cell MC is denoted with Pf. If an ECC capable of error correction of ∈=0 is used, that is, no ECC is used, a transition from 0 to 1 or 2 in the cell state of the three-terminal cell cannot change the logical state of $Z_2$. At this time, the fault probability becomes Pf. A transition from 1 or 2 to in the cell state of the three-terminal cell can change the logical state of $Z_2$. At this time, the fault probability becomes Pf. Therefore, the logical state of $Z_2$ changes from '0' to '1' at a fault probability of $(Pf)^2$. Therefore, the retention fault property can be improved to $(Pf)^2$.

The use of such an ECC that can correct a fault in one memory cell MC (corresponding to ∈=1) of two three-terminal cells, for example, a Humming code makes it possible to correct a transition from 0 to 3 in the cell state of the three-terminal cell caused at a fault probability $(Pf)^2$. Therefore, the retention fault property can be improved nearly to $(Pf)^4$. In this case, two three-terminal cells are used to store information data and two three-terminal cells are used to store the Humming code. Therefore, eight memory cells MC can be used to store 2 ($\approx 2 \times \log_2 2$) bits of information data.

The use of such an ECC that can correct faults in two memory cells MC (corresponding to ∈=2) of two three-terminal cells, for example, a BCH code makes it possible to correct transitions from 0 to in the cell state of the three-terminal cells caused at a fault probability $(Pf)^2$ even when the transitions arise simultaneously in two memory cells MC. Therefore, the retention fault property can be improved nearly to $(Pf)^6$. In this case, two three-terminal cells are used to store information data and four three-terminal cells are used to store a BCH 2-bit correctable code. Therefore, 12 memory cells MC can be used to store 2 ($\approx 2 \times \log_2 2$) bits of information data.

The use of a four-terminal cell is mentioned next.

FIG. 48 is a circuit diagram of a four-terminal cell in the memory system according to the embodiment. The four-terminal cell includes three memory cells MC1-MC3 commonly connected to a word line WL as shown in FIG. 48. In a word, this four-terminal cell has an anode of a memory cell MC1 (bit line BL1), an anode of a memory cell MC2 (bit line BL2), an anode of a memory cell MC3 (bit line BL3), and a cathode of the memory cells MC1-MC3 (word line WL), that is, four terminals in total.

The use of this four-terminal cell can improve the retention property considerably with no ECC. Only if the cell states of three memory cells MC are all at 3, they are associated with a logical state of $Z_2$, '1', and a logical state of $Z_2$, '0', in other cases. Additionally, in the case of '0' write, '0' write is executed to the memory cell MC. In this case, the fault probability of a variation from '0' to '1' is a probability of faults arising in all three memory cells MC, which is $(Pf)^3$. Therefore, the retention fault property can be improved nearly to $(Pf)^3$.

Finally, from the viewpoint of improvements in the retention fault property, relations between ECC codes and retention fault rates are summarized.

FIG. 49 is a diagram showing relations among ECC codes and retention fault rates in the memory system according to the embodiment.

In FIG. 49 "the number of code cells" is the number of memory cells MC required for storing information data by "the number of information bits". In a word, the smaller the number of code cells/the number of information bits, the better the utilization efficiency of the memory cell MC.

Standing on the viewpoint of improvements in the retention property, (1) the fault probability can be lowered down to $(Pf)^2$ by utilizing a LMC of p=2 with no ECC, (2) the fault probability can be lowered down to $(Pf)^4$ and 1-bit error correction is made possible by using four 2-bit storable three-terminal cells and utilizing a Humming code of p=capable of correcting a fault in one three-terminal cell thereof, and (3) the retention fault can be improved to $(Pf)^3$ by using four-terminal cells each composed of three memory cells MC, as can be said.

[Others]

While the embodiments of the present invention have been described, these embodiments are presented by way of example and are not intended to limit the scope of the invention. These novel embodiments can be implemented in a variety of other forms, and various omissions, substitutions and changes can be made without departing from the spirit of the invention. These embodiments and variations thereof would fall within the scope and spirit of the invention and also fall within the invention recited in claims and equivalents thereof.

What is claimed is:

1. A memory system, comprising:
    a cell array including a unit cell array, said unit cell array containing plural first lines, plural second lines intersecting said plural first lines, and plural memory cells provided at the intersections of said plural first lines and said plural second lines and operative to store data in accordance with different physical states; and
    an access circuit operative to make access to said memory cell via said first line and said second line,
    wherein an access-targeted memory cell of said plural memory cells is defined as an access cell, a first line connected to said access cell of said plural first lines is defined as an access first line and other first lines as non-access first lines,
    said access circuit includes two first line drivers each operative to alternately control said first lines on alternate lines,
    one first line driver for controlling said access first line of said two first line drivers is defined as an access-side first line driver and the other first line driver as a non-access-side first line driver, said access-side first line driver and said non-access-side first line driver being arranged across said unit cell array from each other, and
    said access circuit, on writing data in said access cell, uses said non-access-side first line driver to electrically connect said non-access first line adjacent to said access first line to a first potential power supply via a diode-connected transistor.

2. The memory system according to claim 1, wherein said access circuit, on writing data in said access cell, uses said access-side first line driver to provide said access first line with an access first line potential required to make access to said access cell, and bring said non-access first line into the floating state.

3. The memory system according to claim 1, wherein a second line connected to said access cell of said plural second lines is defined as an access second line and other second lines as non-access first lines,
    wherein said access circuit includes two second line drivers each operative to alternately control said second lines on alternate lines, and
    said access circuit, on writing data in said access cell, uses said non-access-side second line driver to electrically connect said non-access second line adjacent to said access second line to said first potential power supply via a diode-connected transistor.

4. The memory system according to claim 3, wherein said access circuit, on writing data in said access cell, uses said access-side second line driver to provide said access second line with an access second line potential required to make access to said access cell, and bring said non-access second line into the floating state.

5. The memory system according to claim 1, further comprising a current monitor operative to monitor the value of current flowing in said first potential power supply.

6. The memory system according to claim 1,
wherein said memory cell has a first physical state and a second physical state as the physical states, and
said access circuit, on writing data in said access cell, changes said access cell to said second physical state and then changes said access cell to said first physical state.

7. The memory system according to claim 1,
wherein said memory cell has a first physical state, a second physical state, and a third physical state as the physical states, wherein said third physical state can be changed to said second physical state with a smaller forward bias than that for changing said first physical state to said second physical state, and
said access circuit, on setting said first physical state to said access cell in said second physical state, applies a reverse bias to change said access cell to said third physical state.

8. The memory system according to claim 6, wherein said access circuit, on writing data in said access cell, changes said access cell to said first physical state and then applies a reverse bias to said memory cell connected to said access second line.

9. A memory system, comprising:
a cell array including a unit cell array, said unit cell array containing plural first lines, plural second lines intersecting said plural first lines, and plural memory cells provided at the intersections of said plural first lines and said plural second lines and operative to store data in accordance with different physical states,
wherein said cell array stores a piece of data in a cell group of plural memory cells, and
a first value of said data is assigned one to one to a combination of stabilized physical states of said plural memory cells contained in said cell group.

10. The memory system according to claim 9, wherein a second value of said data different from said first value is assigned to plural combinations of other physical states different from said combination of said stabilized physical states of said plural memory cells contained in said cell group.

11. The memory system according to claim 9, further comprising an access circuit operative to make access to said memory cell via said first line and said second line,
wherein said cell group includes plural memory cells accessible simultaneously in parallel by said access circuit.

12. The memory system according to claim 9,
wherein said cell array includes plural unit cell arrays, and said plural memory cells contained in said cell group belong to different unit cell arrays.

13. The memory system according to claim 9, wherein said plural memory cells contained in said cell group are commonly connected to one of said second lines.

14. The memory system according to claim 9, wherein a piece of data stored in said cell group contains an error correction code.

15. The memory system according to claim 14, wherein said error correction code is a Humming code, a BCH code, or a Lee metric code.

16. The memory system according to claim 9, wherein a distance between two memory cells contained in a certain cell group is substantially the same as the distance between two memory cells contained in another cell group.

17. A memory system, comprising:
a cell array including a unit cell array, said unit cell array containing plural first lines, plural second lines intersecting said plural first lines, and plural memory cells provided at the intersections of said plural first lines and said plural second lines and operative to store data in accordance with different physical states; and
an access circuit operative to make access to said memory cell via said first line and said second line,
wherein said cell array stores a piece of data in a cell group of plural memory cells,
a first value of said data is assigned one to one to a combination of stabilized physical states of said plural memory cells contained in said cell group,
an access-targeted memory cell of said plural memory cells is defined as an access cell, wherein a first line connected to said access cell of said plural first lines is defined as an access first line and other first lines as non-access first lines,
said access circuit includes two first line drivers each operative to alternately control said first lines on alternate lines,
one first line driver for controlling said access first line of said two first line drivers is defined as an access-side first line driver and the other first line driver as a non-access-side first line driver, said access-side first line driver and said non-access-side first line driver being arranged across said unit cell array from each other, and
said access circuit, on writing data in said access cell, uses said non-access-side first line driver to electrically connect said non-access first line adjacent to said access first line to a first potential power supply via a diode-connected transistor.

18. The memory system according to claim 17, wherein a second value of said data different from said first value is assigned to plural combinations of other physical states different from said combination of said stabilized physical states of said plural memory cells contained in said cell group.

19. The memory system according to claim 17, further comprising an access circuit operative to make access to said memory cell via said first line and said second line,
wherein said cell group includes plural memory cells accessible simultaneously in parallel by said access circuit.

20. The memory system according to claim 17, wherein said plural memory cells contained in said cell group are commonly connected to one of said second lines.

* * * * *